(12) United States Patent
Zhu et al.

(10) Patent No.: US 7,485,520 B2
(45) Date of Patent: Feb. 3, 2009

(54) METHOD OF MANUFACTURING A BODY-CONTACTED FINFET

(75) Inventors: Huilong Zhu, Poughkeepsie, NY (US); Thomas W. Dyer, Pleasant Valley, NY (US); Jack A. Mandelman, Flat Rock, NC (US); Werner Rausch, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 21 days.

(21) Appl. No.: 11/773,607

(22) Filed: Jul. 5, 2007

(65) Prior Publication Data

US 2009/0008705 A1    Jan. 8, 2009

(51) Int. Cl.
*H01L 21/336* (2006.01)

(52) U.S. Cl. .................. 438/197; 438/283; 438/299; 438/301; 257/E21.301

(58) Field of Classification Search .............. 438/197, 438/283, 284, 157, 299, 301; 257/E21.301
See application file for complete search history.

(56) References Cited

U.S. PATENT DOCUMENTS

| 5,286,565 | A | 2/1994 | Holzl et al. |
|---|---|---|---|
| 5,304,397 | A | 4/1994 | Holzl et al. |
| 6,069,390 | A | 5/2000 | Hsu et al. |
| 6,413,802 | B1 * | 7/2002 | Hu et al. ............. 438/151 |
| 6,429,482 | B1 | 8/2002 | Culp et al. |
| 6,512,275 | B1 | 1/2003 | Hsu et al. |
| 6,624,459 | B1 | 9/2003 | Dachtera et al. |
| 6,750,109 | B2 | 6/2004 | Culp et al. |
| 6,809,368 | B2 | 10/2004 | Divakaruni et al. |
| 6,815,282 | B2 | 11/2004 | Dachtera et al. |
| 6,897,107 | B2 | 5/2005 | Divakaruni et al. |
| 6,913,960 | B2 | 7/2005 | Bryant et al. |
| 7,138,685 | B2 | 11/2006 | Hsu et al. |
| 7,173,310 | B2 | 2/2007 | Voldman et al. |
| 7,288,802 | B2 * | 10/2007 | Anderson et al. ........... 257/192 |
| 7,341,915 | B2 * | 3/2008 | Li et al. .................... 438/283 |
| 2002/0140030 | A1 | 10/2002 | Mandelman et al. |
| 2002/0149047 | A1 | 10/2002 | Divakaruni et al. |
| 2002/0149058 | A1 | 10/2002 | Culp et al. |
| 2003/0218198 | A1 | 11/2003 | Dachtera et al. |
| 2004/0106258 | A1 | 6/2004 | Divakaruni et al. |
| 2004/0113207 | A1 | 6/2004 | Hsu et al. |
| 2004/0155275 | A1 | 8/2004 | Divakaruni et al. |
| 2006/0091463 | A1 | 5/2006 | Donze et al. |
| 2006/0273372 | A1 | 12/2006 | Voldman et al. |
| 2007/0007601 | A1 | 1/2007 | Hsu et al. |
| 2007/0194353 | A1 * | 8/2007 | Snyder .................... 257/280 |

\* cited by examiner

*Primary Examiner*—Michael Trinh
(74) *Attorney, Agent, or Firm*—Scully, Scott, Murphy & Presser, P.C.; Joseph P. Abate, Esq.

(57) ABSTRACT

A silicon containing fin is formed on a semiconductor substrate. A silicon oxide layer is formed around the bottom of the silicon containing fin. A gate dielectric is formed on the silicon containing fin followed by formation of a gate electrode. While protecting the portion of the semiconductor fin around the channel, a bottom portion of the silicon containing semiconductor fin is etched by a isotropic etch leaving a body strap between the channel of a finFET on the silicon containing fin and an underlying semiconductor layer underneath the silicon oxide layer. The fin may comprise a stack of inhomogeneous layers in which a bottom layer is etched selectively to a top semiconductor layer. Alternatively, the fin may comprise a homogeneous semiconductor material and the silicon containing fin may be protected by dielectric films on the sidewalls and top surfaces of the silicon containing fin.

1 Claim, 37 Drawing Sheets

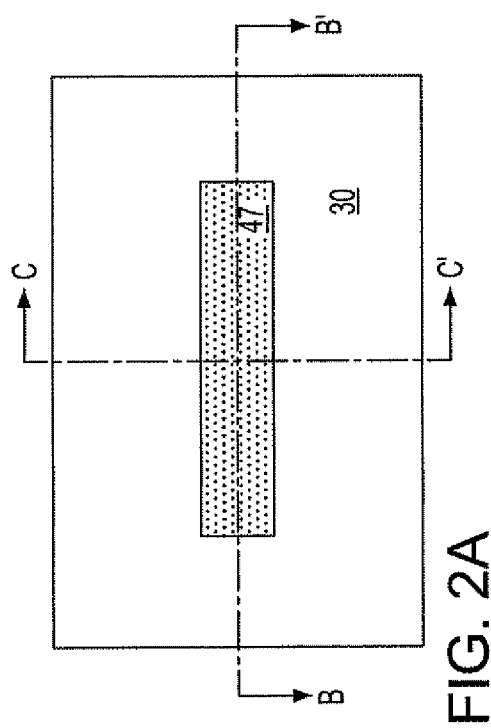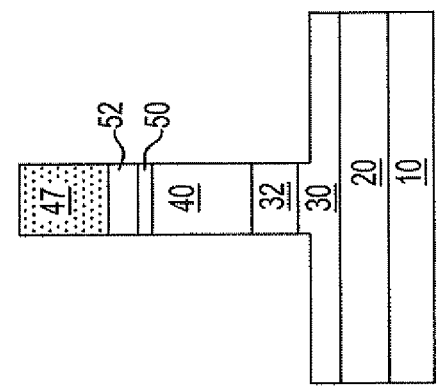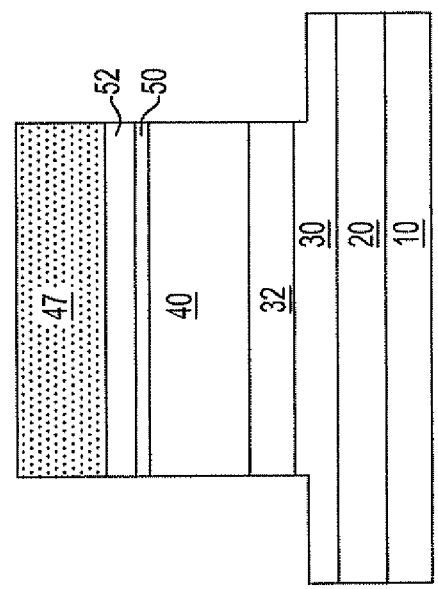

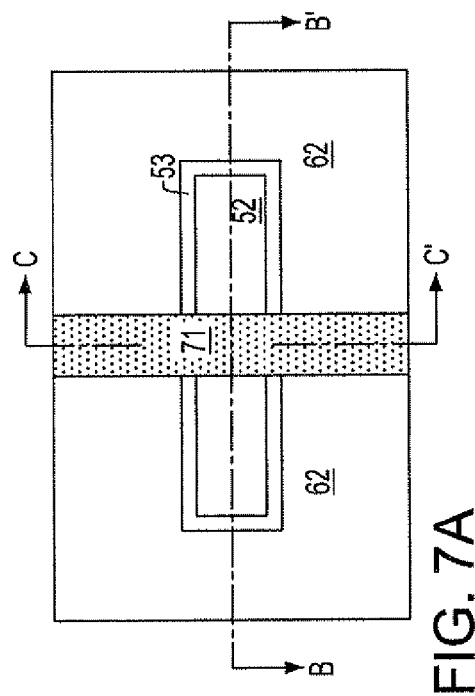
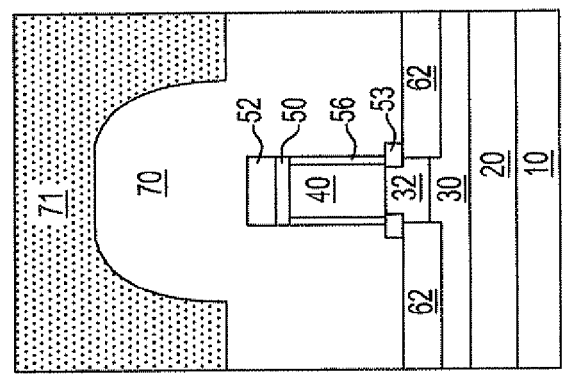
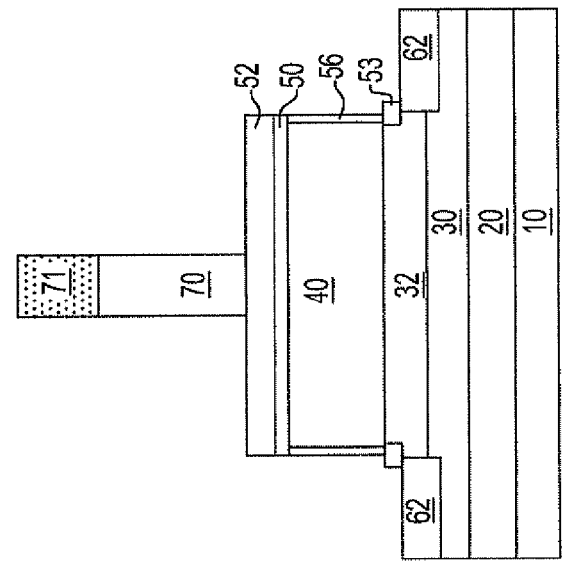
FIG. 7A
FIG. 7B
FIG. 7C

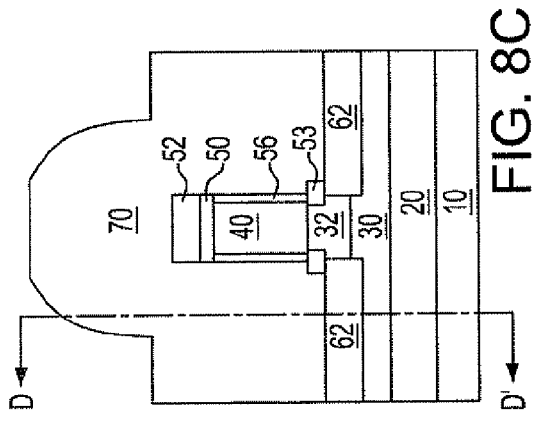
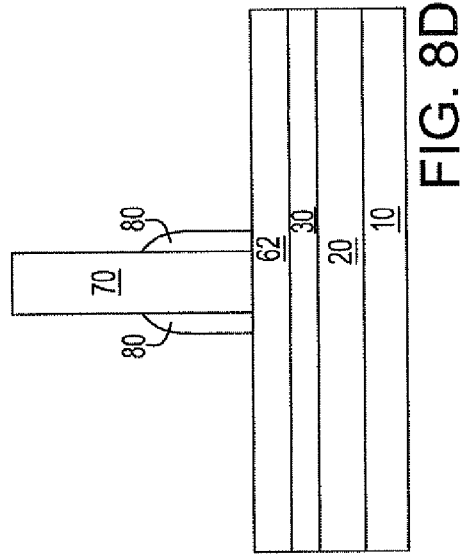
FIG. 8C
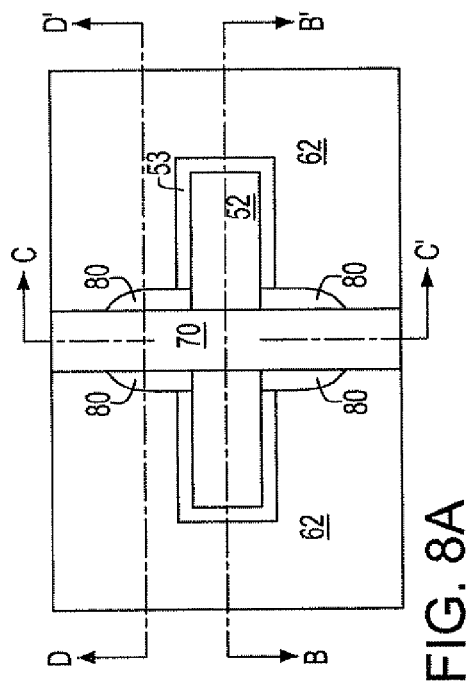
FIG. 8A
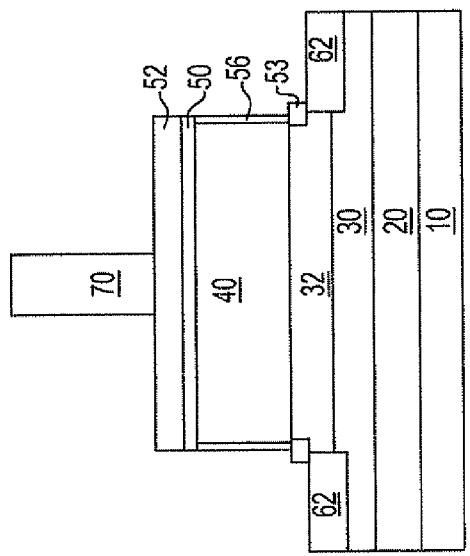
FIG. 8B
FIG. 8D

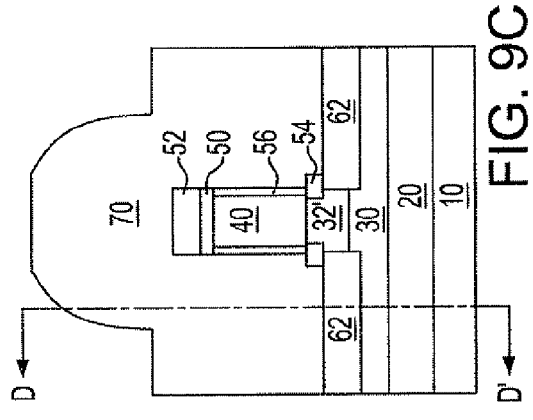
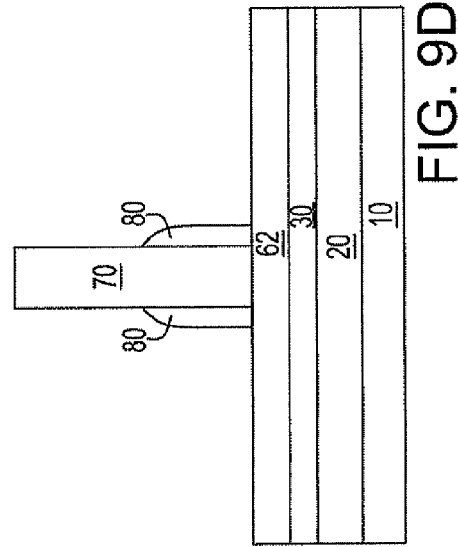
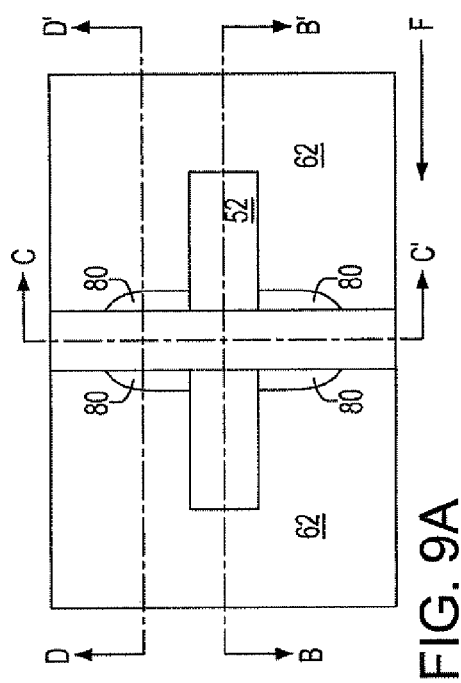
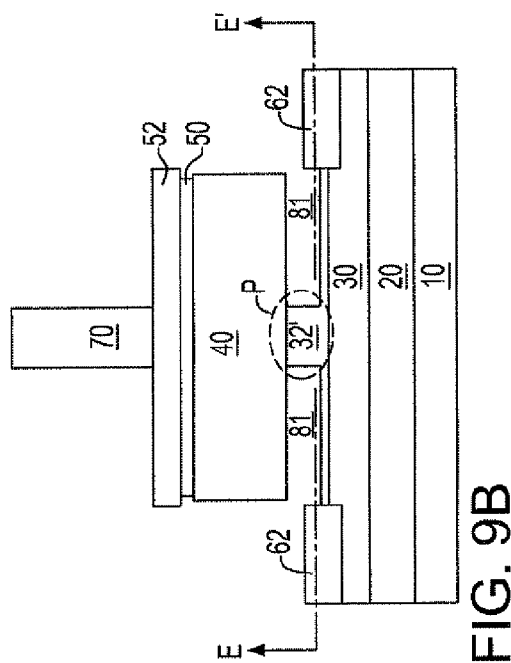
FIG. 9A
FIG. 9B
FIG. 9C
FIG. 9D

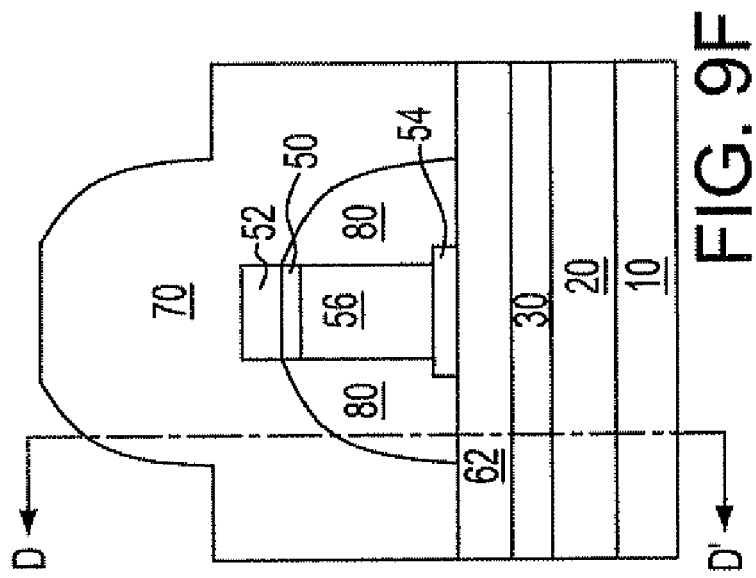
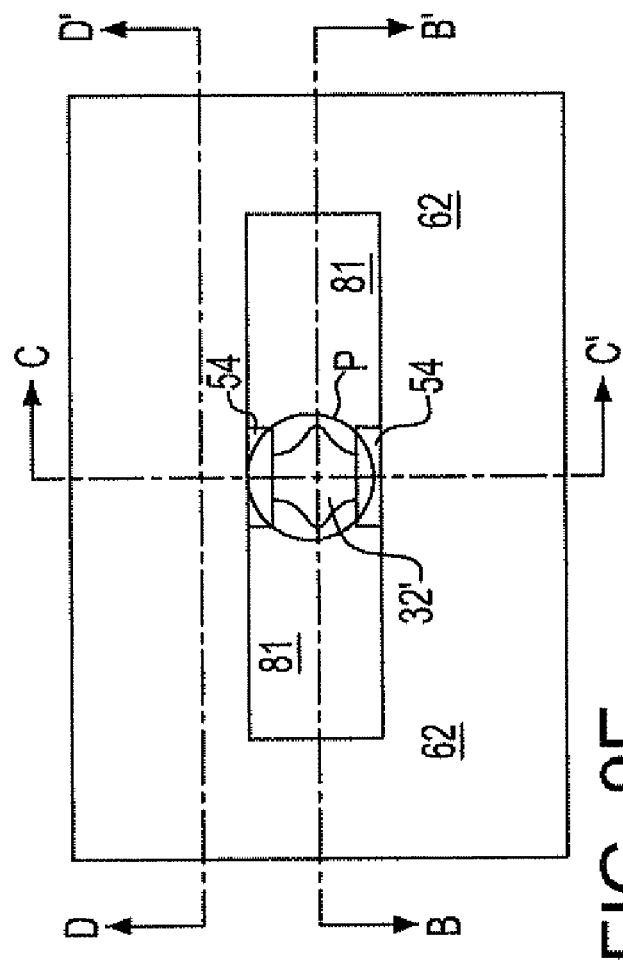
FIG. 9F
FIG. 9E

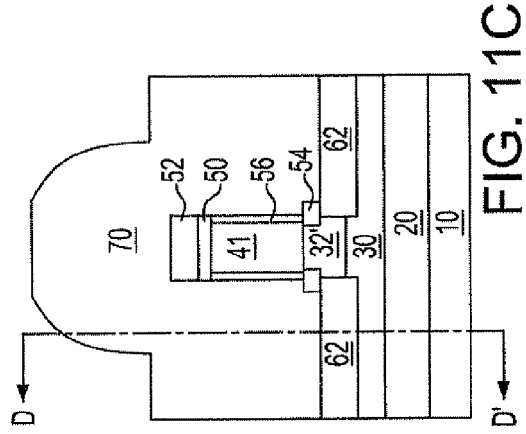
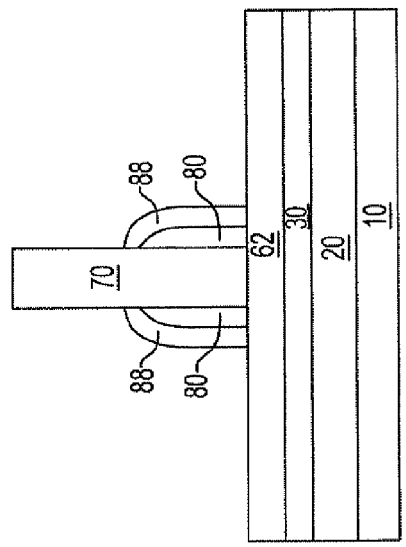
FIG. 11A
FIG. 11C
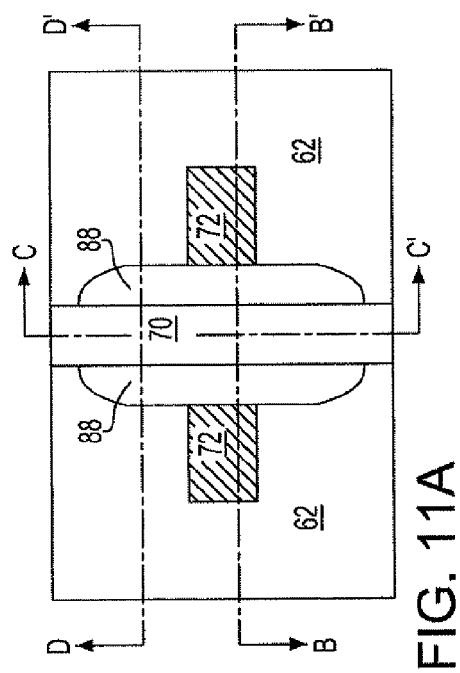
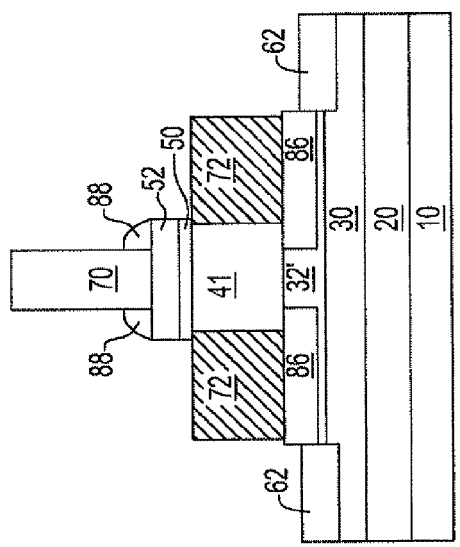
FIG. 11B
FIG. 11D

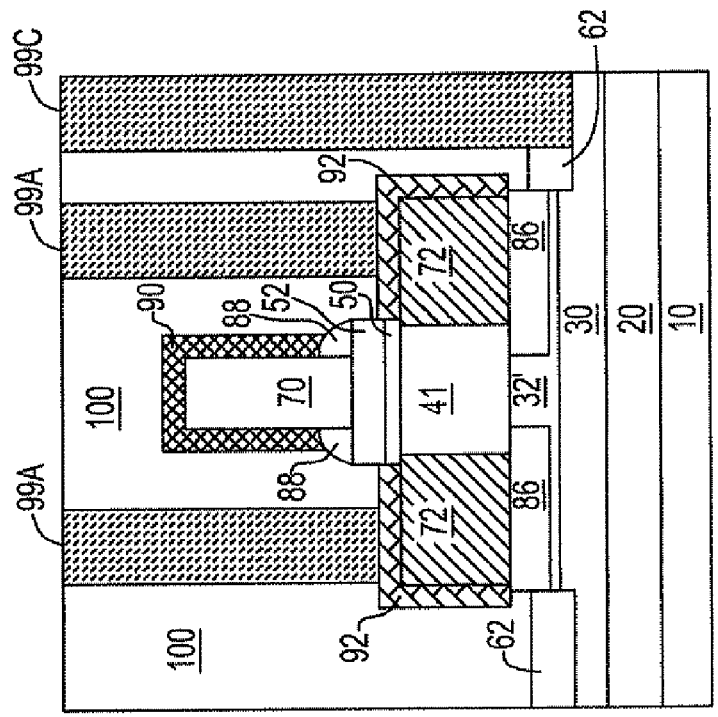
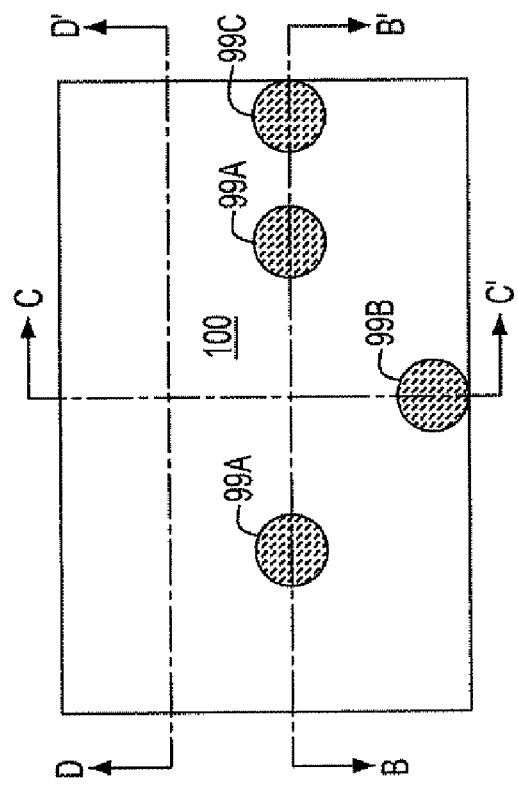
FIG. 13B
FIG. 13A

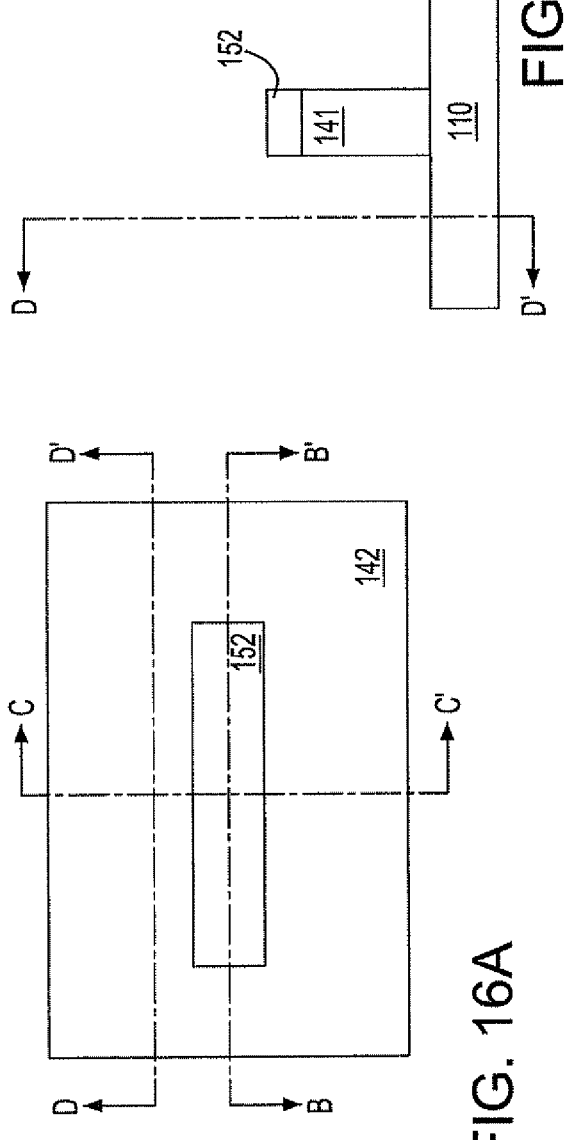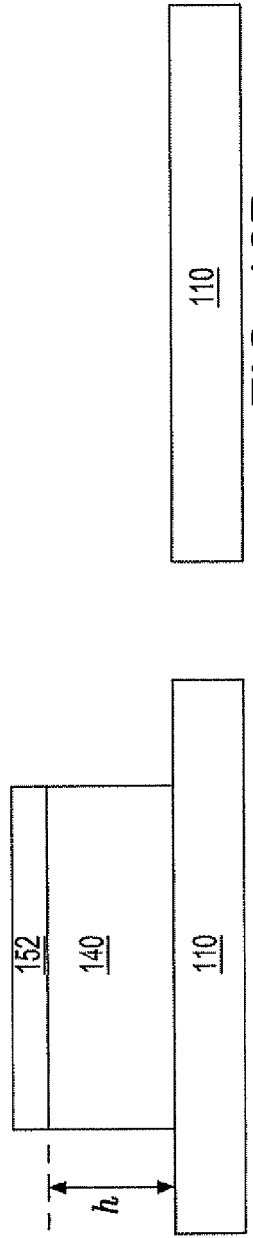

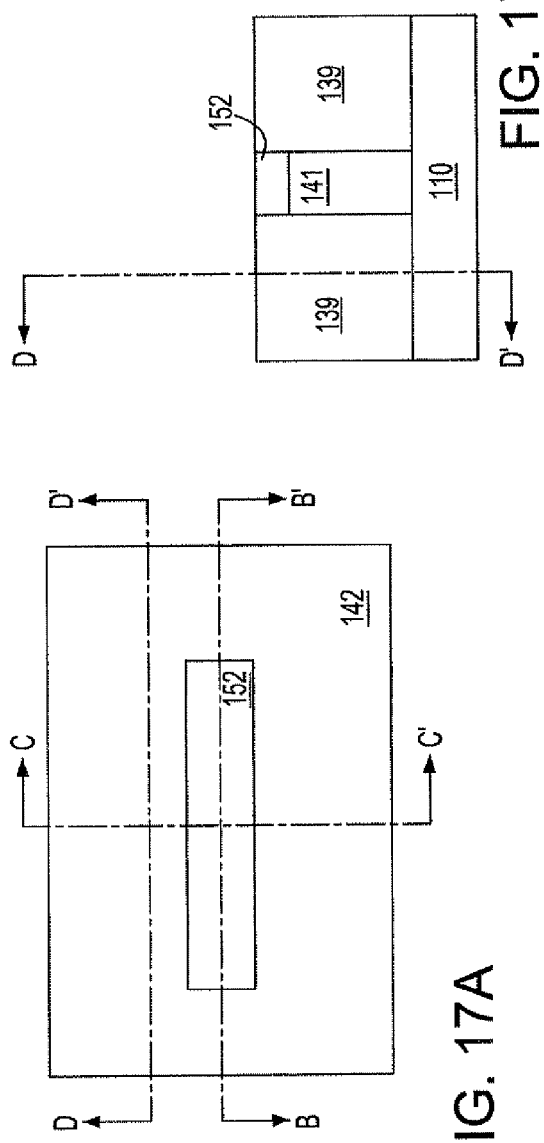
FIG. 17A
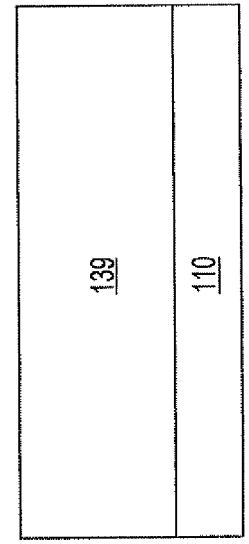
FIG. 17C
FIG. 17D
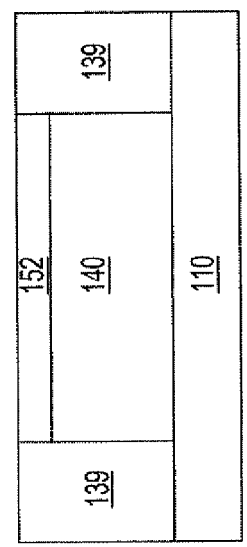
FIG. 17B

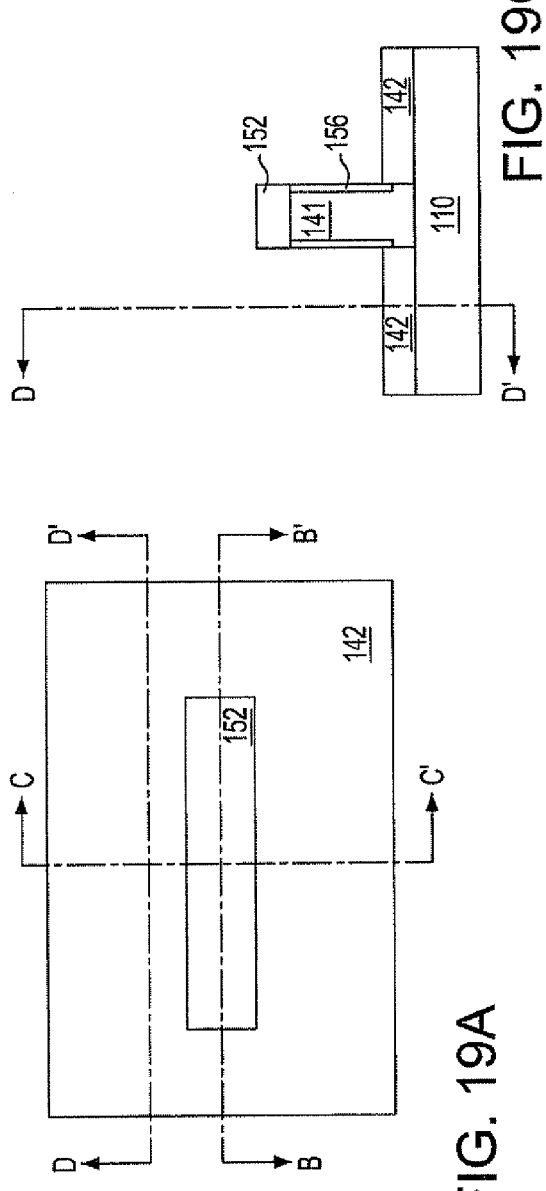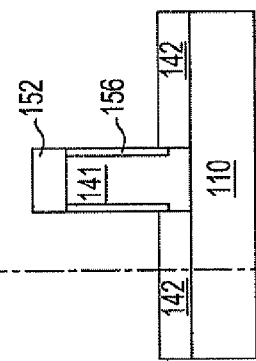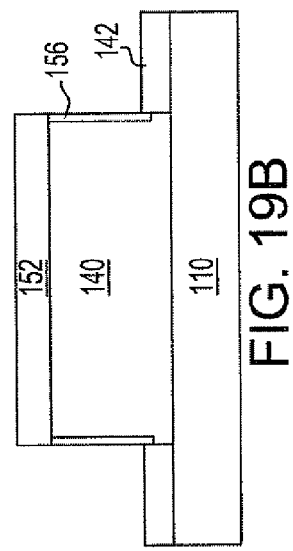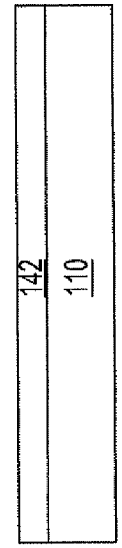

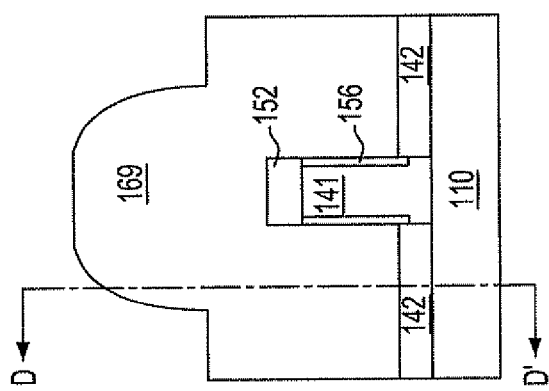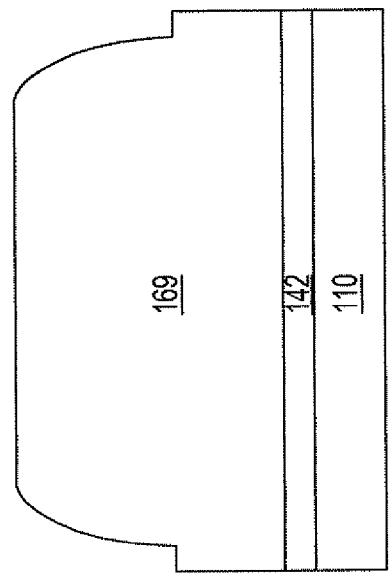
FIG. 20C
FIG. 20D
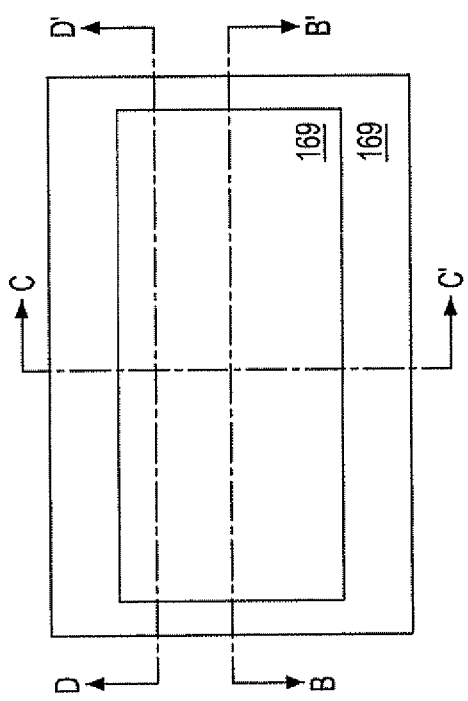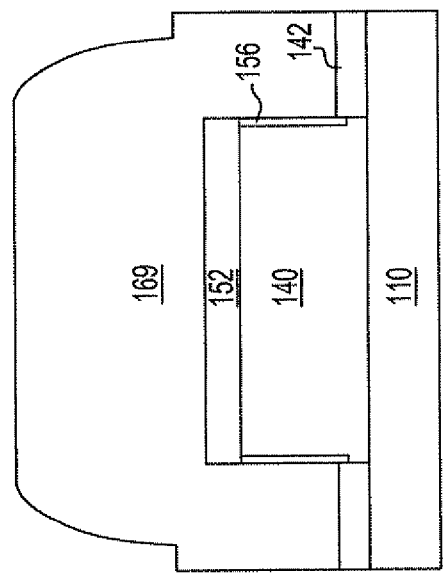
FIG. 20A
FIG. 20B

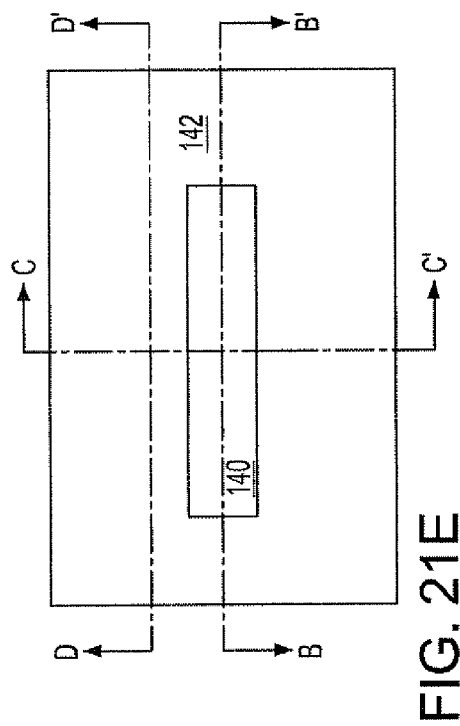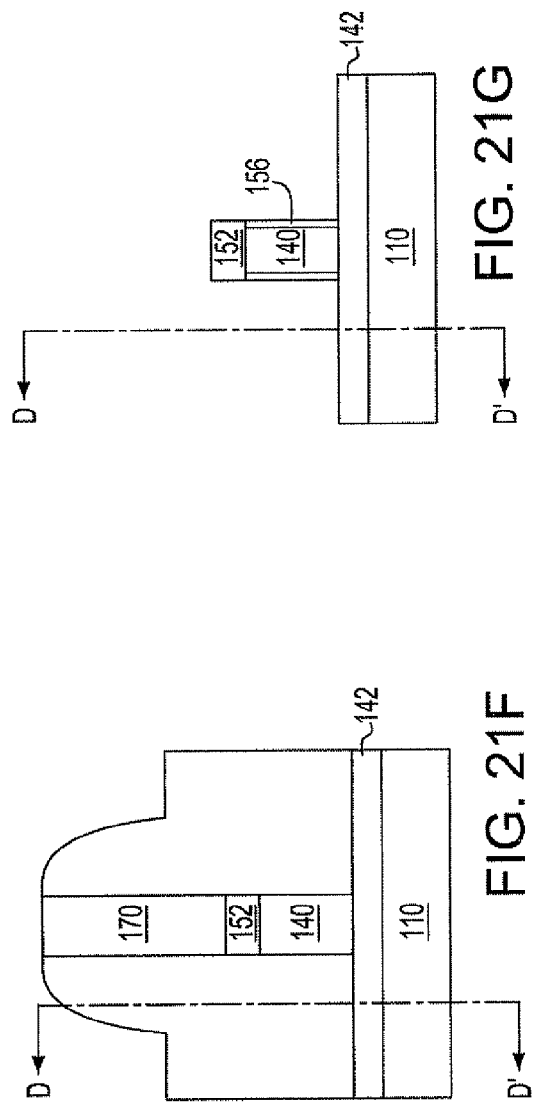

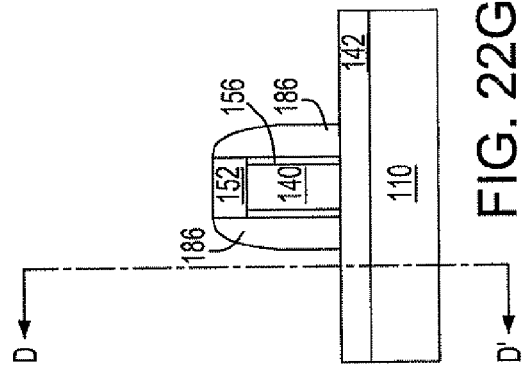
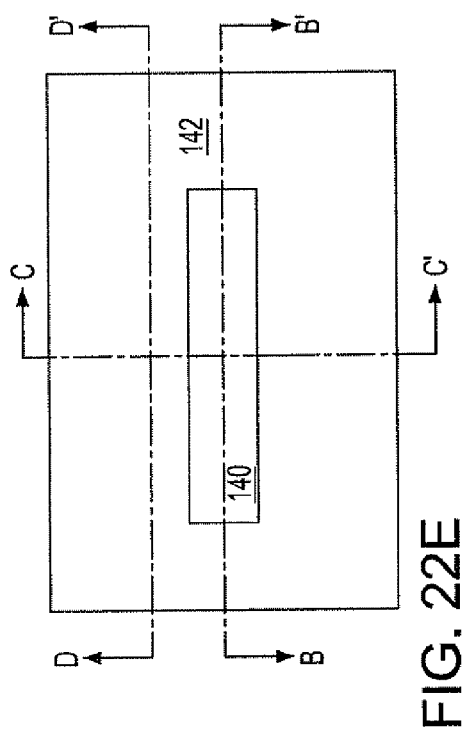
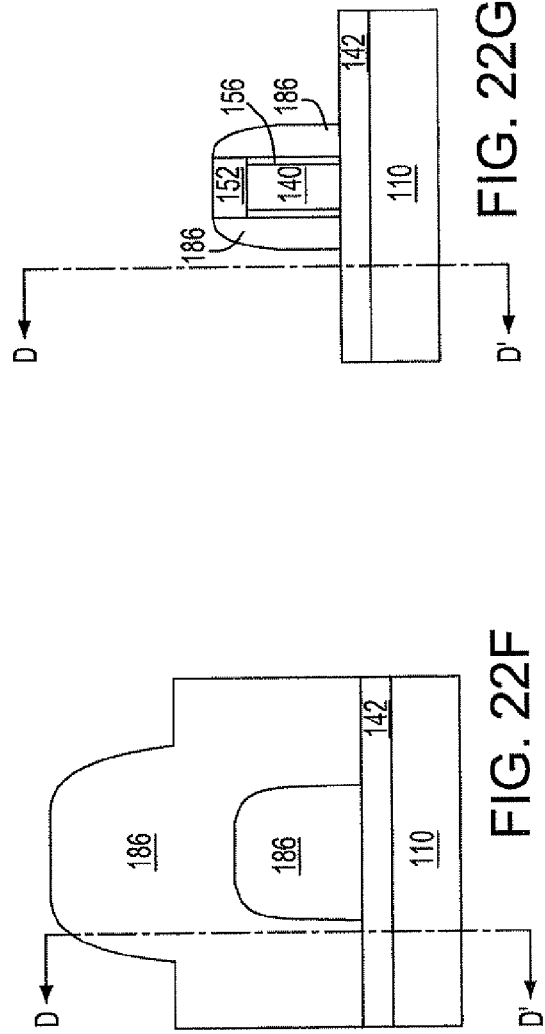

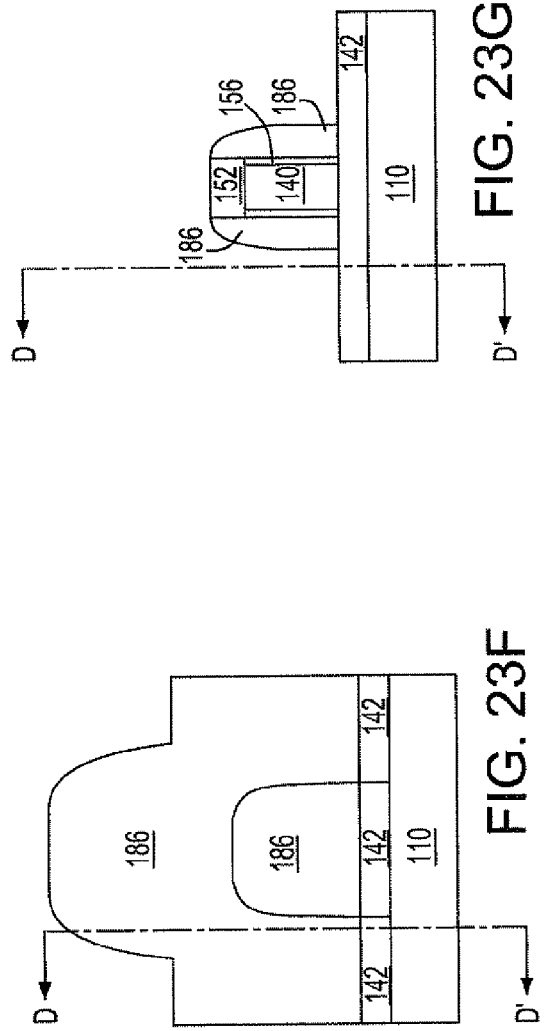
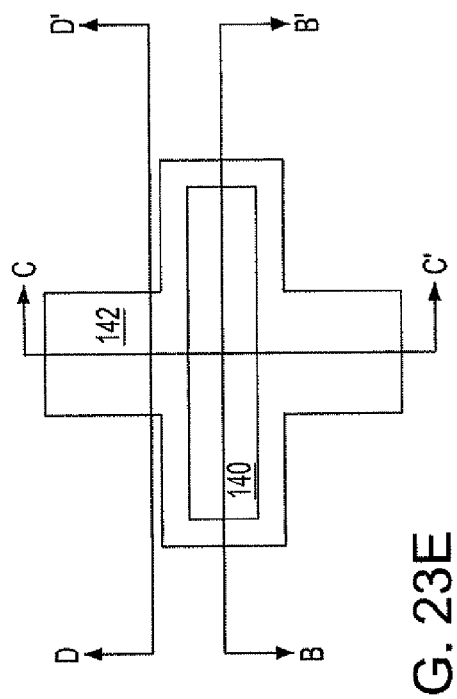

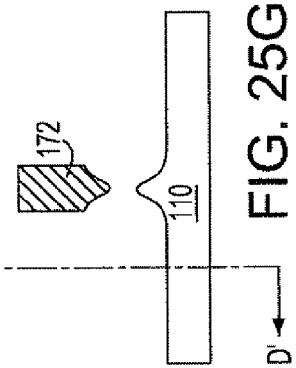
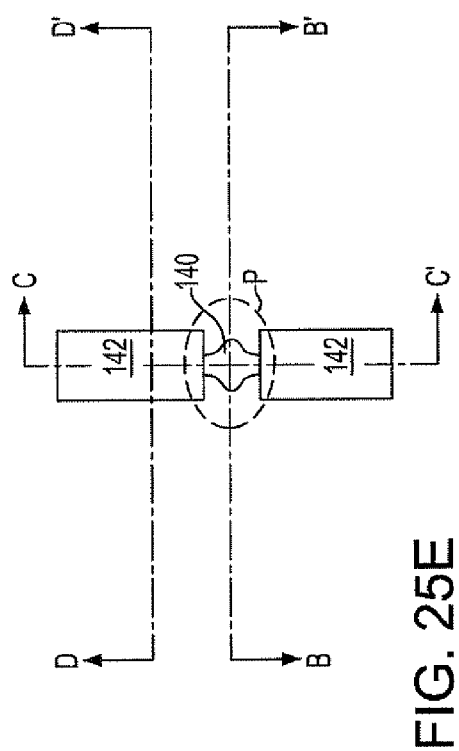
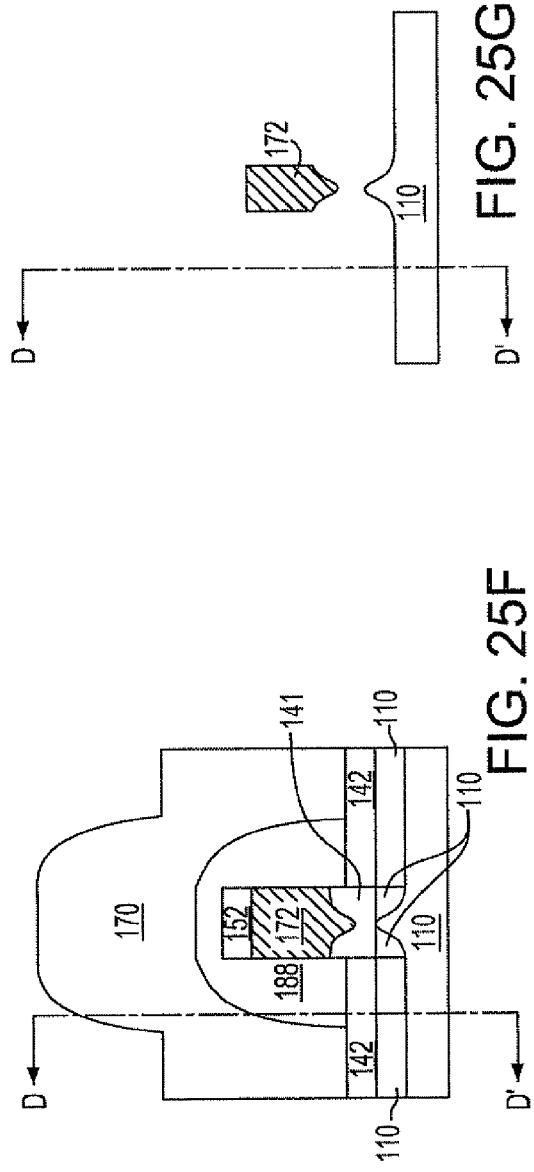

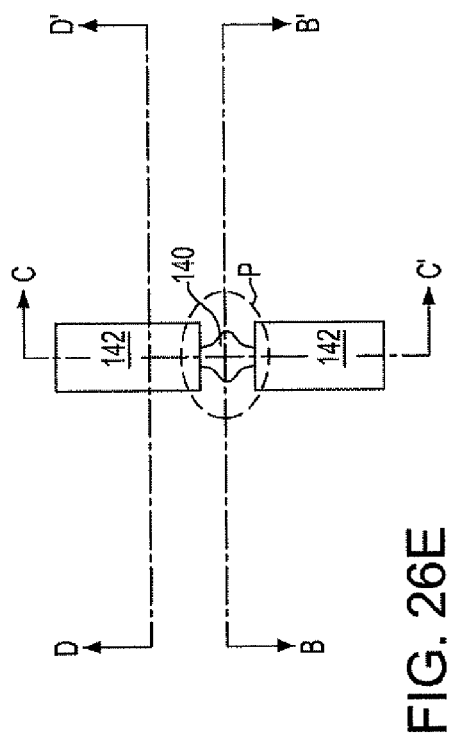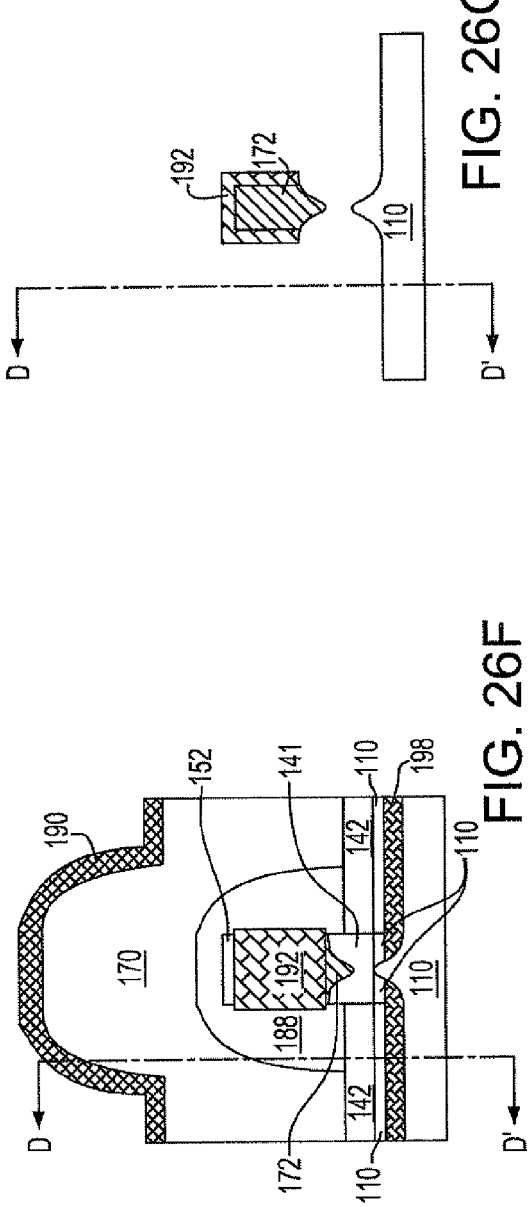

METHOD OF MANUFACTURING A BODY-CONTACTED FINFET

FIELD OF THE INVENTION

The present invention relates to semiconductor devices, and particularly to finFET structures with a body contact and methods of manufacturing the same.

BACKGROUND OF THE INVENTION

Fin metal-oxide-semiconductor field effect transistor (Fin-MOSFET) is an emerging technology which provides solutions to metal-oxide-semiconductor field effect transistor (MOSFET) scaling problems at, and below, the 45 nm node. FinMOSFET structures include fin field effect transistors (finFETs), which comprise at least one narrow (preferably <10 nm wide) semiconductor fin gated on at least two opposing sides of each of the at least one semiconductor fin. Preferred prior art finFET structures are formed on a semiconductor-on-insulator (SOI) substrate, because of low source/drain diffusion to substrate capacitance and ease of electrical isolation by shallow trench isolation structures.

However, finFETs fabricated on a SOI substrate suffer from floating body effects, as is well known for conventional planar MOSFETs. The body of a finFET on an SOI substrate stores charge which is a function of the history of the device, hence becoming a "floating" body. As such, floating body finFETs experience threshold voltages which are difficult to anticipate and control, and which vary in time. The body charge storage effects result in dynamic sub-threshold voltage (sub-Vt) leakage and threshold voltage (Vt) mismatch among geometrically identical adjacent devices. Floating body effects in finFETs are particularly a concern in static random access memory (SRAM) cells, where Vt matching is extremely important as operating voltages continue to be scaled down. The floating body also poses leakage problems for pass gate devices. Still another concern with floating body finFETs is with stacked devices, as used in logic gates, in which the conductive state of devices higher up in the stack are strongly influenced by stored body charge, because of reduced gate-to-source voltage (Vgs) overdrive available to these devices. In view of the above stated problems with finFETs fabricated on SOI substrates, it is desirable to eliminate floating body effects by building finFETs incorporating body contacts.

The challenge in forming a body-contacted finFET is to do so without degrading its positive attributes, such as high immunity to short channel effects, steep sub-Vt slope, and high current drive capability due to volume inversion. Although several prior art contacted body finFETs have been identified, all fail to preserve the desirable attributes of the device.

For example, U.S. Patent Application Publication No. 2006/0091463 provides an elongated widened portion of a semiconductor fin between source-drain regions formed in adjacent narrow fin regions. The widened portion of the fin is contacted from above. The presence of the widened portion of the fin in the channel current path seriously degrades the desirable attributes of the finFET. In addition to loss of short channel Vt control, the widened fin portion has a different threshold voltage and channel conductance, which would degrade the channel current. The channel length needs to be much greater than a lithographically printable minimum dimension to avoid body contact to diffusion shorts.

U.S. Pat. No. 6,913,960 discloses another body contacted finFET in which a contact to the body of the finFET is formed on a first side of the fin and the second side of the fin is gated through a thin dielectric by a gate conductor. The gate conductor contacts the body on the first side of the fin, providing a dynamic Vt device. For this structure to work properly, shorting between the body contact and the source-drain diffusions must be avoided. For this to occur, the source-drain diffusions must be confined to close to the second sidewall surface of the fin. Due to the extremely narrow width of the fin, shorting between body contact and source-drain diffusions is virtually assured to occur. If the width of the fin is increased to prevent the source-drain diffusions from approaching the second (body contact) side of the fin, many of the desirable attributes of the finFET would be seriously degraded.

In view of the above, there is a need to provide a finFET formed on an insulating substrate, whereby a body contact is provided in such a way that does not degrade the desirable attributes of the finFET.

SUMMARY OF THE INVENTION

The present invention addresses the needs described above by providing structures and fabrication methods for finFET devices formed on a semiconductor-on-insulator (SOI) substrate, wherein the finFET devices are provided with a body contact that preserves the desirable attributes of the finFET.

Two embodiments of the present invention are disclosed herein. A silicon containing fin is formed on a semiconductor substrate. A silicon oxide layer is formed around the bottom of the silicon containing fin. A gate dielectric is formed on the silicon containing fin followed by formation of a gate electrode. While protecting the portion of the semiconductor fin around the channel, a bottom portion of the silicon containing semiconductor fin is etched by an isotropic etch leaving a body strap between the channel of a finFET on the silicon containing fin and an underlying semiconductor layer underneath the silicon oxide layer. The fin may comprise a stack of inhomogeneous layers in which a bottom layer is etched selectively to a top semiconductor layer. Alternatively, the fin may comprise a homogeneous semiconductor material and the silicon containing fin may be protected by dielectric films on the sidewalls and top surfaces of the silicon containing fin.

According to an aspect of the present invention, a semiconductor structure comprises:
a. a semiconductor fin having a body and source and drain regions;
b. a semiconductor pedestal located underneath and abutting the body;
c. a dielectric material layer located underneath and abutting the body, the source and drain regions, and the semiconductor pedestal; and
d. a semiconductor layer abutting the semiconductor pedestal and the dielectric material layer and disjoined from the source and drain regions.

The body and the semiconductor pedestal are doped with dopants of a first conductivity type and the source and drain regions are doped with dopants of a second conductivity type, wherein the second conductivity type is the opposite of the first conductivity type.

The semiconductor structure may further comprise:
a. a gate dielectric located directly on two sidewalls of the body;
b. at least one fin cap layer located directly on a top surface of the body; and
c. a gate electrode located directly on the gate dielectric and the at least one fin cap layer.

The semiconductor structure may further comprise:
a. a gate metal-semiconductor alloy located directly on a top surface and sidewalls of the gate conductor;
b. a source and drain metal-semiconductor alloy located directly on a top surface of the source and drain regions;
c. a gate contact via abutting the gate metal-semiconductor alloy; and
d. a source and drain contact via abutting the source and drain metal-semiconductor alloy.

The semiconductor structure may further comprise a body contact via abutting the semiconductor layer. The semiconductor pedestal may have two parallel straight edges and four concave surfaces. Alternatively, semiconductor pedestal may have faceted crystallographic surfaces.

According to a first embodiment of the present invention, the semiconductor structure may further comprise a silicon oxide layer abutting the semiconductor layer, the gate electrode, the semiconductor pedestal, and the dielectric material layer, and having a cavity containing the semiconductor pedestal. The semiconductor structure may further comprise two disjoined silicon germanium oxide blocks abutting the body, the gate dielectric, the gate electrode, the semiconductor pedestal, and the silicon oxide layer. The semiconductor layer may comprise a silicon germanium alloy with an atomic concentration of germanium from about 2 percent to about 15 percent and the semiconductor surface has a substantially flat bottom surface.

According to a second embodiment of the present invention, the semiconductor fin may have a bottom surface containing two adjoined curved grooves with a concave curvature. The semiconductor layer may have a top surface containing two adjoined curved grooves with a concave curvature, wherein the two adjoined curved grooves abut one of the two disjoined portions of the dielectric layer.

The semiconductor structure may further comprise:
a. a body metal-semiconductor alloy located directly on a top surface of the semiconductor layer and in a body metal-semiconductor alloy area; and
b. a body contact via abutting the body metal-semiconductor alloy, wherein a horizontal cross-sectional area of the semiconductor fin overlaps the body metal-semiconductor alloy area and the semiconductor fin is disjoined from the body metal-semiconductor alloy.

According to another aspect of the present invention, methods of manufacturing semiconductor structures are provided.

A first method of manufacturing a semiconductor structure comprises:
a. forming a semiconductor fin containing a silicon layer and a silicon germanium layer on a semiconductor substrate, wherein the silicon germanium layer is located directly beneath the silicon layer;
b. forming a silicon oxide layer directly on the semiconductor substrate and sidewalls of the silicon germanium layer, wherein the silicon oxide layer is disjoined from the silicon layer;
c. forming a gate dielectric directly on the semiconductor fin;
d. forming a gate conductor directly on the gate dielectric; and
e. removing the silicon germanium alloy layer from end portions of the semiconductor fin by a substantially isotropic etch, wherein a remaining portion of the silicon germanium alloy layer in a center portion of the semiconductor fin constitutes a semiconductor pedestal providing an electrically conductive path between the semiconductor fin and the semiconductor substrate.

A second method of manufacturing a semiconductor comprises:
a. forming a semiconductor fin on a semiconductor substrate;
b. forming a silicon oxide layer directly on the semiconductor substrate and sidewalls of the semiconductor fin, wherein an upper portion of the semiconductor fin is exposed;
c. forming a gate dielectric directly on the semiconductor fin;
d. forming a gate conductor directly on the gate dielectric;
e. exposing a bottom portion of the semiconductor fin by removing the silicon oxide layer; and
f. removing bottom portions of the semiconductor fin and a top surface of the semiconductor substrate by a substantially isotropic etch, wherein remaining portions of the semiconductor fin and the semiconductor substrate underneath the gate conductor constitute a semiconductor pedestal providing an electrically conductive path between the semiconductor fin and the semiconductor substrate.

BRIEF DESCRIPTION OF THE DRAWINGS

FIGS. 1A-14D show sequential views of a first exemplary finFET structure according to a first embodiment of the present invention. Figures with the same numeric label correspond to the same stage of manufacturing. Figures with the suffix "A" are top-down views. Figures with the suffix "B," "C," or "D" are vertical cross-sectional views along the plane B-B', C-C', or D-D' respectively, of the corresponding figure with the same numeric label and the suffix "A." FIG. 9E is a horizontal cross-sectional view of the first exemplary structure along the plane E-E' in FIG. 9B. FIG. 9F is a side view of the first exemplary structure in the direction F in FIG. 9A.

FIGS. 15A-27D show sequential views of a second exemplary finFET structure according to a second embodiment of the present invention. Figures with the suffix "A" are top-down views. Figures with the suffix "B," "C," "D," or "G" are vertical cross-sectional views along the plane B-B', C-C', D-D', or G-G' respectively, of the corresponding figure with the same numeric label and the suffix "A." Figures with the suffix "E" are horizontal cross-sectional views along the plane E-E' of the corresponding figure with the same numeric label and the suffix "B." Figures with the suffix "F" are side views of the corresponding figure with the same numeric label and the suffix "A."

DETAILED DESCRIPTION OF THE INVENTION

Figures 1A, 1B, 1C:
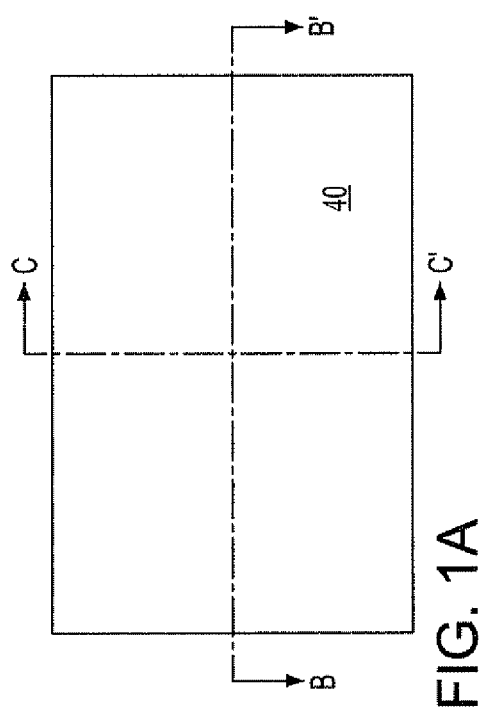

As stated above, the present invention relates to finFET structures with a body contact and methods of manufacturing the same, two embodiments of which are now described in detail with accompanying figures. It is noted that like and corresponding elements are referred to by like reference numerals.

Embodiment #1

Referring to FIGS. 1A-1C, a first exemplary semiconductor structure according to a first embodiment of the present invention comprises a semiconductor-on-insulator (SOI) substrate having a handle substrate 10, a buried insulator layer 20, a first top semiconductor layer 30, a second semiconductor layer 32, and a third semiconductor layer 40. The three top semiconductor layers (30, 32, 40) are single crystalline and epitaxially aligned among one another.

The second top semiconductor layer 32 comprises a silicon germanium alloy with an atomic concentration of germanium from about 2 percent to about 15 percent, and preferably from about 2 percent to about 5 percent. The third top semiconductor layer 40 may comprise silicon and have inconsequential amount of germanium, for example, less than 0.1 percent. The third top semiconductor layer 40 may consist of silicon and electrical dopants such as B, Ga, In, P, As, and/or Sb. The second top semiconductor layer 32 may be etched by a wet etch or a dry etch selectively to the third top semiconductor layer 40. For example, if the second top semiconductor layer 32 is a silicon germanium alloy with an atomic concentration of germanium from about 2 percent to about 5 percent and third top semiconductor layer is silicon, a reactive ion etch (RIE) process containing $CH_xF_y$ gases such as $CF_4$ and $CHF_3$. may be employed for the selective etch process.

Stress affecting elements such as carbon or germanium may be incorporated into the first top semiconductor layer 30. For example, the first top semiconductor layer 30 may be a silicon germanium layer so that biaxial stress is applied to the second and third top semiconductor layers (32, 40). In this case, an initial substrate may be a silicon-germanium-on-insulator (SGOI) substrate having the handle substrate 10, the buried insulator layer 20, and the first top semiconductor layer 30. The second top semiconductor layer 32 and the third semiconductor layer 40 may be epitaxially grown so that the third top semiconductor layer 30 may be under a biaxial stress. In case the third top semiconductor layer 40 is a silicon layer, a biaxial tensile stress is present in the third top semiconductor layer 40. One skilled in the art may introduce carbon into the first top semiconductor layer 30 to achieve a biaxial compressive stress on the third top semiconductor layer 40.

The first top semiconductor layer 30 may comprises a silicon germanium alloy with an atomic concentration of germanium from about 2 percent to about 15 percent, and preferably from about 5 percent to about 15 percent.

The thickness of the first top semiconductor layer 30 may be from about 30 nm to about 200 nm, and preferably from about 40 nm to about 60 nm. The thickness of the second top semiconductor layer 32 may be from about 10 nm to about 100 nm, and preferably from about 30 nm to about 60 nm. The thickness of the third top semiconductor layer 40 may be from about 30 nm to about 200 nm, and preferably from about 50 nm to about 100 nm. The first, second, and third top semiconductor layers (30, 32, 40) may be p-doped or n-doped with a dopant concentration typically from about $5.0 \times 10^{15}/cm^3$ to about $3.0 \times 10^{17}/cm^3$. Preferably, the first, second, and third top semiconductor layers (30, 32, 40) have the same type of dopants, which are referred to as dopants of a first conductivity type.

While it is preferred that the third top semiconductor layer 40 comprises a silicon containing semiconductor material, i.e., a semiconductor material that includes silicon, the present invention may be practiced with other semiconductor material provided that a suitable etch chemistry can be found that can etch the material of the second top semiconductor layer 32 selectively to the material of the third top semiconductor layer 40. Known semiconductor materials include Si, SiC, SiGe, SiGeC, Ge alloys, GaAs, InAs, InP, other III-V or II-VI compound semiconductors.

Referring to FIGS. 2A-2C, at least one pad layer is deposited on the third top semiconductor layer 40 and lithographically patterned. The at least one pad layer may comprise a stack of a first pad layer 50 and a second pad layer 52. The first pad layer 50 may be, for example, a thin silicon oxide layer having a thickness from about 3 nm to about 10 nm. The second pad layer 52 may be, for example, a silicon nitride layer having a thickness from about 10 nm to about 30 nm. A first photoresist 47 is applied to a top surface of the at least one pad layer and lithographically patterned. The pattern in the first photoresist 53 is transferred through the second pad layer 52, the first pad layer 50, the third top semiconductor substrate 40, and the second top semiconductor substrate 32, and partly into the first top semiconductor substrate 30 to form a semiconductor fin. Consequently, the semiconductor fin comprises the third top semiconductor substrate 40, the second top semiconductor substrate 32, and a portion of the first top semiconductor substrate 30. The width of the semiconductor fin may be from about 10 nm to about 100 nm. The length of the semiconductor fin may be from about 100 nm to about 500 nm. The height of the semiconductor fin is the sum of the height of the third top semiconductor layer 40, the second top semiconductor layer 32, and the exposed upper portion of the first top semiconductor layer and may be from about 50 nm to about 400 nm.

Figure 3C:
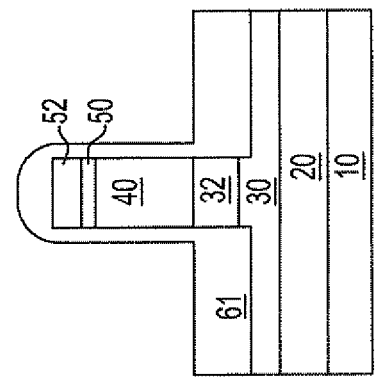
Figure 3A:
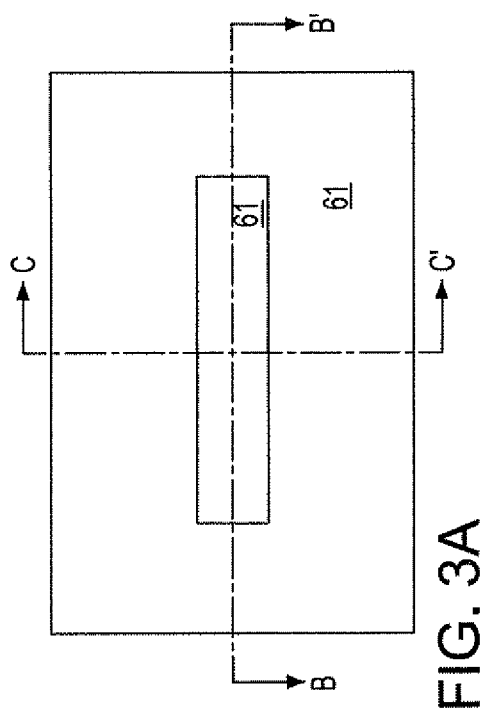
Figure 3B:
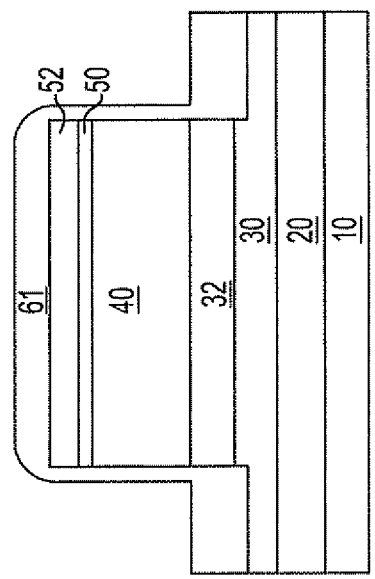

Referring to FIGS. 3A-3C, the first photoresist 47 is removed, for example, by ashing. A non-conformal silicon oxide layer 61 is formed on top of the semiconductor fin, on the sidewalls of the semiconductor fin, and on the third top semiconductor layer 40. The non-conformal silicon oxide layer 61 may be a high density plasma chemical vapor deposition (HDPCVD) oxide. Consequently, the thickness of the non-conformal silicon oxide layer on the sidewalls of the semiconductor fin is less than the thickness of the same on the third top semiconductor layer 40. The deposition process may provide some sputtering during deposition, as is the case with a HDPCVD oxide deposition, and as a consequence, the thickness of the non-conformal silicon oxide film on the top surface of the semiconductor fin may be less than the thickness of the same on the third top semiconductor layer 40.

Figure 4C:
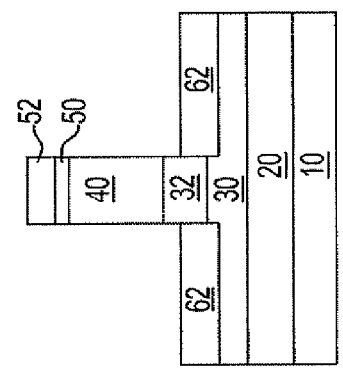
Figure 4A:
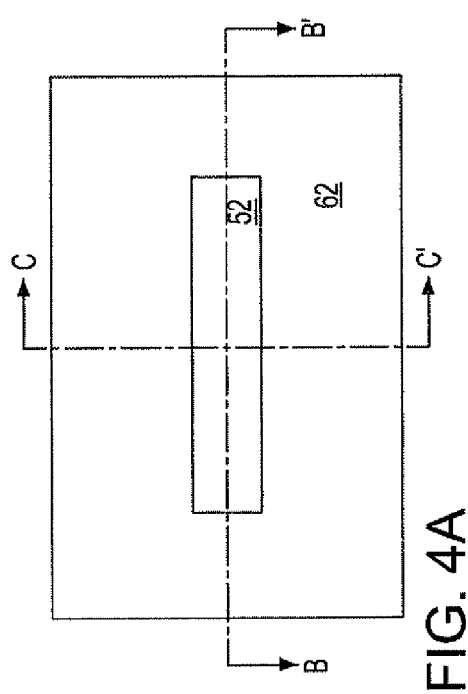
Figure 4B:
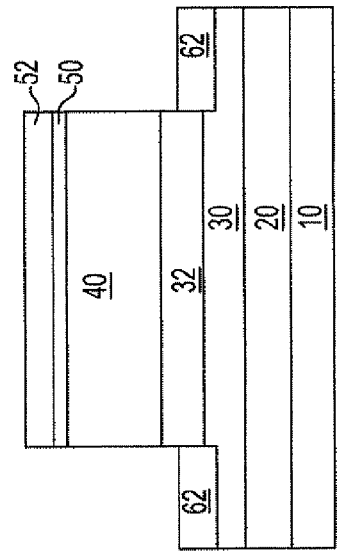

Referring to FIGS. 4A-4C, the non-conformal silicon oxide layer 61 is isotropically etched and removed from the sidewalls and the top surface of the semiconductor fin. The remaining portion of the non-conformal silicon oxide layer 61 on the third top semiconductor layer 40 constitutes a silicon oxide layer 62. It is noted that the thickness of the non-conformal silicon oxide film 61 may, or may not, be less on the top surface of the semiconductor fin than on the third top semiconductor layer 40 since an additional silicon oxide layer on top of the second pad layer 52 does not alter the practicability of the present invention. The silicon oxide layer 62 has a cavity, or a hole, around the semiconductor fin. The silicon oxide layer 62 contacts an upper portion of the first semiconductor layer 30 and a lower portion of the second top semiconductor layer 32.

Figure 5A:
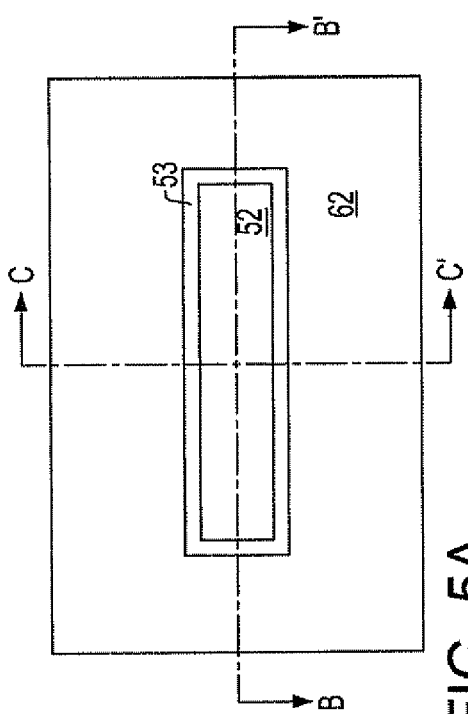
Figure 5B:
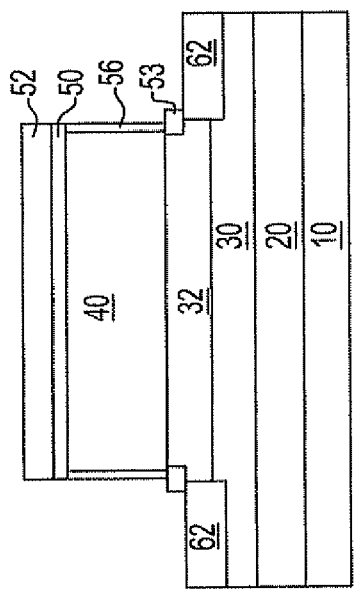
Figure 5C:
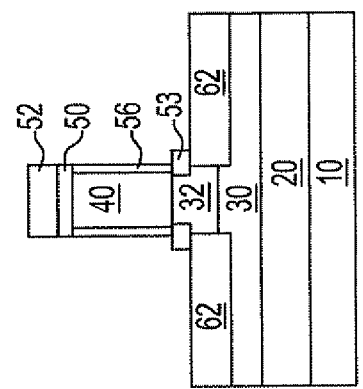

Referring to FIGS. 5A-5C, thermal oxidation is performed on exposed surfaces of the semiconductor fin, i.e., on the sidewalls of the third top semiconductor layer 40 and on the upper portion of the sidewalls of the second top semiconductor layer 32. The silicon germanium alloy in the second top semiconductor layer 32 has a higher oxidation rate than the semiconductor material of the third top semiconductor layer 40, which may be, for example, a silicon layer. Since the exposed surfaces of the second top semiconductor layer 32 has a shape of a band, a silicon germanium oxide ring 53 is formed therefrom around the semiconductor fin by the thermal oxidation, i.e., the shape of the silicon germanium oxide material is topologically homomorphic to a torus. A semiconductor oxide 56 is formed by thermal oxidation of the third top semiconductor layer 40 on the sidewalls of the semiconductor fin above the silicon germanium oxide ring. The semiconductor oxide 56 may constitute a gate dielectric. Alternatively, another gate dielectric layer, such as a high-K dielectric material layer may be deposited over the semiconductor oxide 56 to form a composite stack of gate dielectric. In a variation of the first exemplary structure, the semiconductor oxide 56 may be removed while preserving a portion of the silicon germanium ring 56 and a chemical vapor deposition gate dielectric, such as a high-K dielectric material layer, may be formed.

Figure 6A:
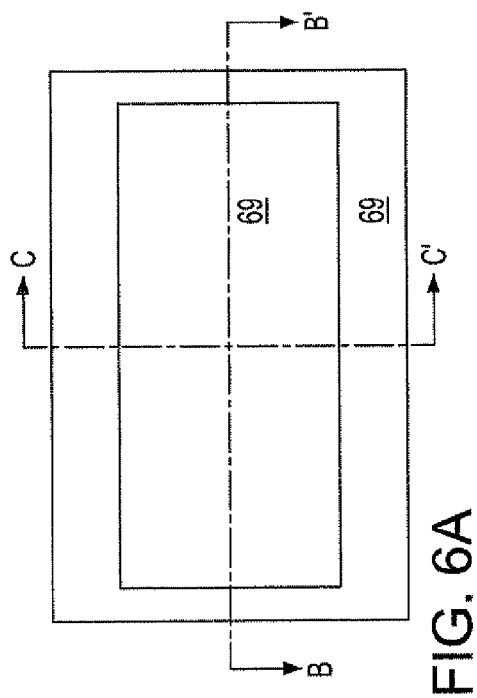
Figure 6B:
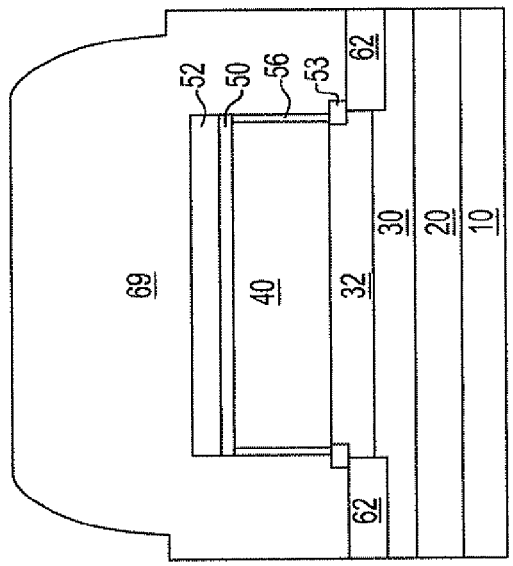
Figure 6C:
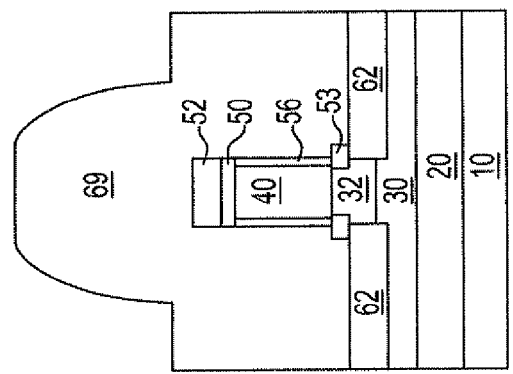
Figure 10A:
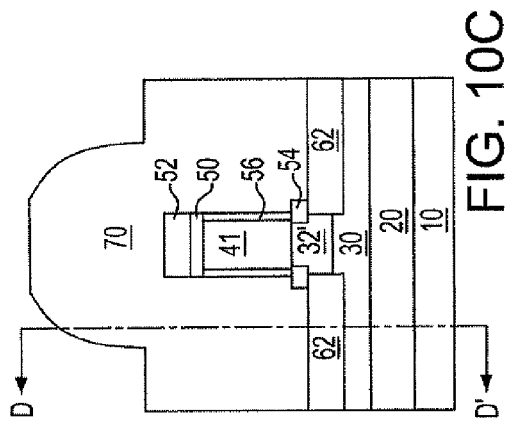
Figure 10C:
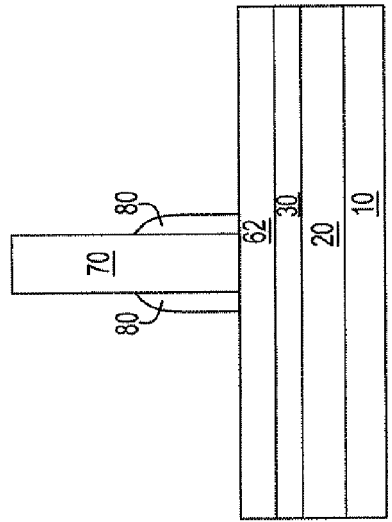
Figure 10B:
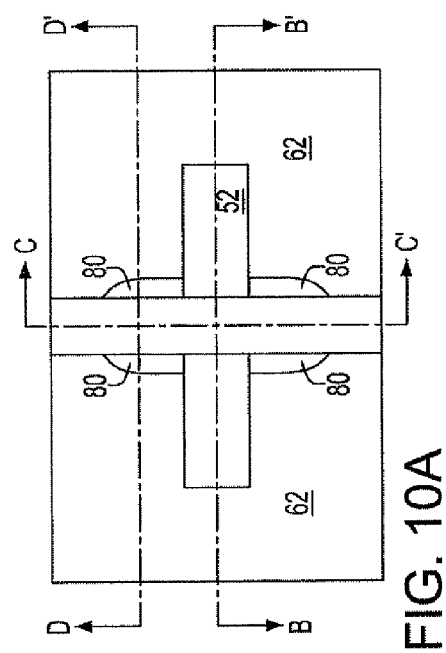
Figure 10D:
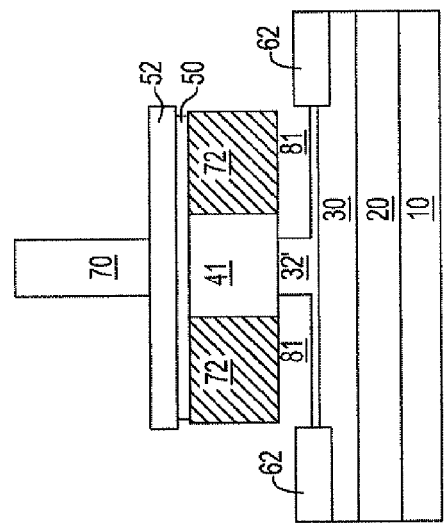
Figure 12A:
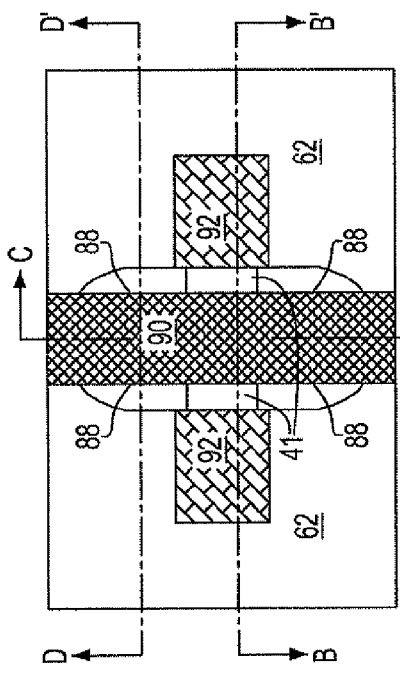
Figure 12C:
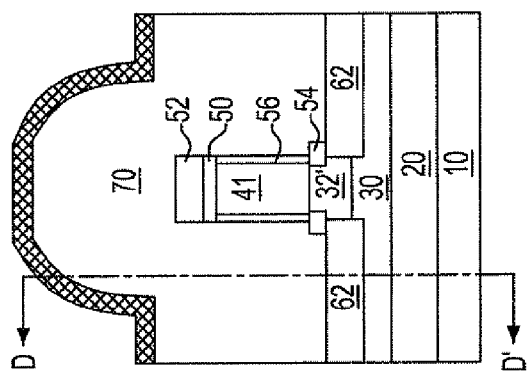
Figure 12B:
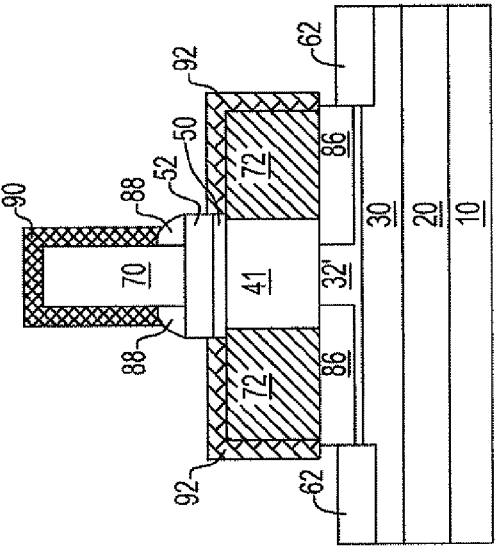
Figure 12D:
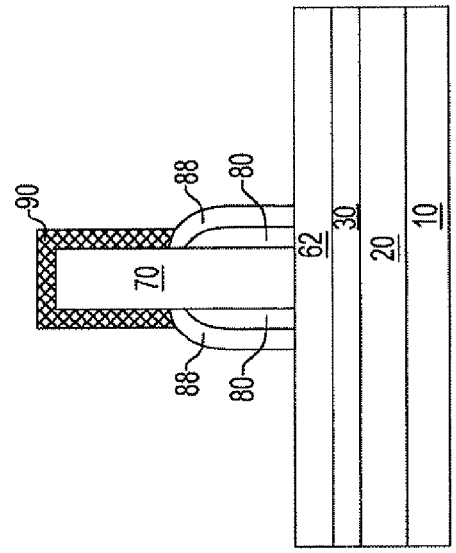
Figure 13D:
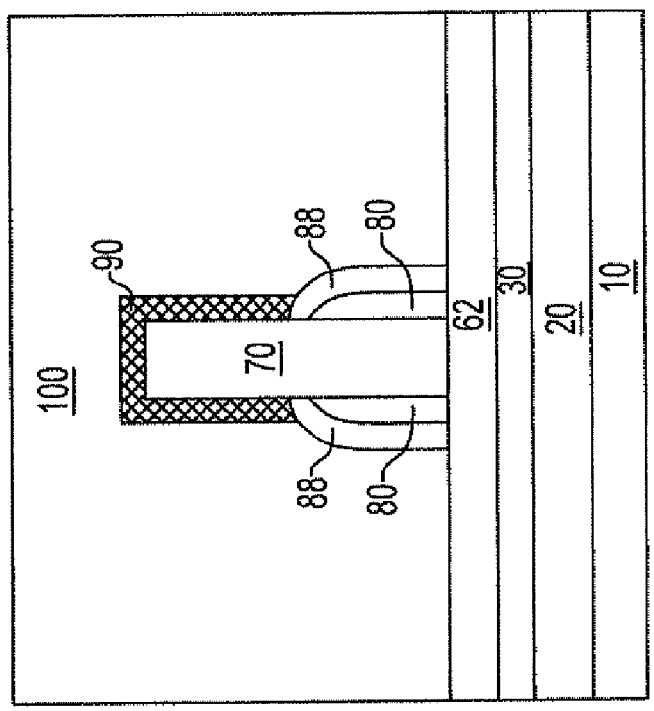
Figure 13C:
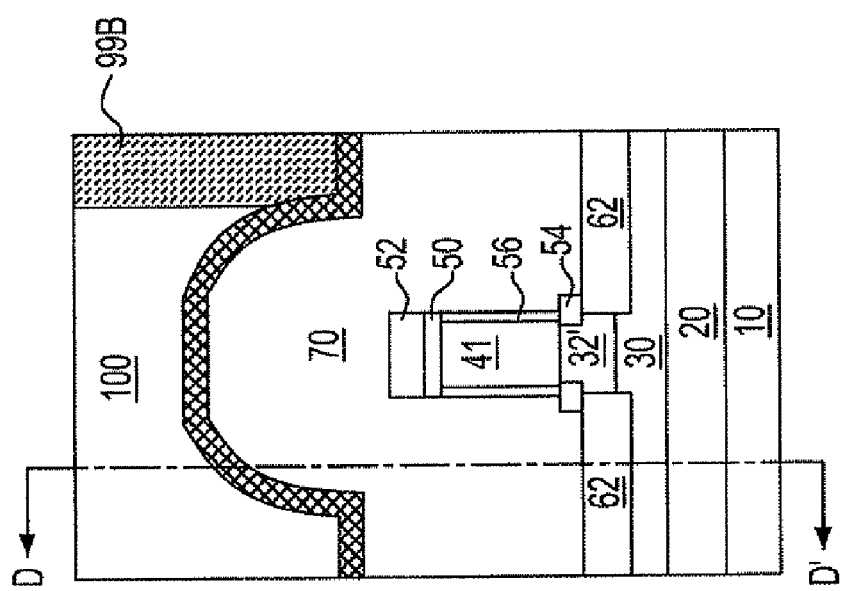

Referring to FIGS. 6A-6C, a gate conductor layer 69 is formed over the semiconductor fin and the silicon oxide layer 62, for example, by chemical vapor deposition (CVD). The gate conductor layer 69 comprises a conductive material such as doped polysilicon. In case the gate conductor layer 69 comprises doped polysilicon, the gate conductor may be deposited with in-situ doping or may be deposited as intrinsic polysilicon and implanted with dopants subsequently. The thickness of the gate conductor layer 69 may exceed the total height of the semiconductor fin and the at least one pad layers (50, 52). While planarization of the gate conductor layer 69 is not employed in the first exemplary structure, the method of planarizing the gate conductor layer 69 and the resulting structure are explicitly contemplated herein.

Referring to FIGS. 7A-7C, the gate conductor layer 69 is lithographically patterned and etched to form a gate electrode 70. Specifically, a second photoresist 71 is applied over the gate conductor layer 69 and lithographically patterned. The pattern in the second photoresist 71 is then transferred into the gate conductor layer 69 by a reactive ion etch that is selective to the at least one pad layer (50, 52) and the silicon oxide layer 62. The material of the gate conductor layer 69 is removed from the area outside the patterned second photoresist 71. The second photoresist 71 is subsequently removed.

Referring to FIGS. 8A-8D, a halo implantation may optionally be performed to adjust the threshold voltage of the finFET to be formed. Optional first spacers 80 may be formed on the portion of the sidewalls of the gate electrode 70 by deposition of a first dielectric layer and an anisotropic reactive ion etch. During the formation of the optional first spacers 80, the first dielectric layer is sufficiently etched so that the portions of the semiconductor fin more than the thickness of the first dielectric layer away from the gate electrode 70 are free of any remaining first dielectric layer. The optional first spacers 80 may comprise a nitride, an oxide, or a combination thereof. The optional first spacers 80 may be silicon nitride. The thickness of the optional first spacer 80, as measured laterally from the gate electrode 70 at the base of the optional first spacer 80, may be from about 5 nm to about 30 nm. The optional first spacers 80 serves the function of moving the starting point of an isotropic etch of the second top semiconductor layer 32 away from the intersection area of the gate electrode 70 and the semiconductor fin as seen from above in a top-down view during the processing step of the isotropic etch to be subsequently performed.

Referring to FIGS. 9A-9F, the portions of the semiconductor dielectric 56 and the silicon germanium oxide ring 53 that are not covered by the gate electrode 70 are removed by an isotropic etch which may be, for example, a wet etch containing hydrofluoric acid (HF). The remaining portions of the silicon germanium oxide ring forms two disjoined silicon germanium oxide blocks 54 abutting the third top semiconductor layer 40 of the semiconductor fin, the gate dielectric 56, the gate electrode 70, the second top semiconductor layer 32 of the semiconductor fin, and the silicon oxide layer 62.

The portion of the silicon germanium alloy in the second top semiconductor layer 32 is thereafter removed by an isotropic etch selective to the material of the third top semiconductor layer 40. In case the second top semiconductor layer 32 is a silicon germanium alloy with an atomic concentration of germanium from about 2 percent to about 5 percent and third top semiconductor layer is silicon, a reactive ion etch (RIE) process containing $CH_xF_y$ gases such as $CF_4$ and $CHF_3$ may be employed for the selective etch process. Selectivity of about 10:1 up to about 40:1 for germanium containing silicon over pure silicon material with such RIE chemistry is known in the art.

The duration of the isotropic etch is controlled so that a portion of the second top semiconductor layer 32 remains under the gate electrode 70. The remaining portion of the second top semiconductor layer 32 constitutes a semiconductor pedestal P that is the only non-dielectric-material structural connection between the semiconductor fin and the semiconductor substrate containing the first semiconductor layer 30. Thus, the semiconductor pedestal P constitutes the only electrically conductive path between the semiconductor fin and the semiconductor substrate containing the first semiconductor layer 30. The semiconductor pedestal P may have two parallel straight edges abutting the two disjoined silicon germanium oxide blocks 54. The semiconductor pedestal P may have four concave surfaces as shown in the horizontal cross-sectional view of the semiconductor pedestal in FIG. 9E. Alternatively, the semiconductor pedestal P may have faceted crystallographic surfaces that can be generated in a crystallographic etch process. A pair of cavities 81 is formed underneath the remaining portion of the semiconductor fin above the semiconductor pedestal P.

The isotropic etch may stop within the second top semiconductor layer 32 before reaching the first top semiconductor layer 30 or alternatively, may etch through the bottom of the second top semiconductor layer 32 into the first top semiconductor layer 30. The semiconductor pedestal P abuts either the planar portion of the remaining second top semiconductor layer 32 or the remaining portion of the first top semiconductor layer 30. The layer abutting the semiconductor pedestal may comprise a silicon germanium alloy with an atomic concentration of germanium from about 2 percent to about 15 percent.

Referring to FIGS. 10A-10D, source and drain regions 72 may be formed on the exposed portions of the semiconductor fin that are not covered by the gate electrode 70 and/or the optional first spacers 80 at this processing step. Ion implantation or other doping techniques such as gas phase doping or plasma doping may be employed to introduce dopants of a second conductivity type into the end portions of the semiconductor fin. The second conductivity type is the opposite of the first conductivity type. The dose of dopants introduced into the source and drain regions 72 may be at a medium doping level suitable for source and drain extensions, e.g., from about $1.0 \times 10^{19}/cm^3$ to about $1.0 \times 10^{20}/cm^3$, or may be at a high doping level suitable for source and drain main regions, e.g., from about $1.0 \times 10^{20}/cm^3$ to about $2.0 \times 10^{21}/cm^3$. Alternatively, the formation of the source and drain regions may be deferred until the formation of optional second spacers to be subsequently performed in case the optional second spacers are formed.

The remaining portion of the semiconductor fin above the semiconductor pedestal P after excluding the source and drain regions 72 constitutes a body 41 of the finFET. The body 41 is doped with dopants of a first conductivity type. Preferably, the semiconductor pedestal P and the first top semiconductor layer 30 are also doped with dopants of the first conductivity type.

Referring to FIGS. 11A-11D, a dielectric material may be optionally deposited and etched by a reactive ion etch to form a pair of dielectric material layers 86 underneath the semiconductor fin and optional second spacers 88 on the gate electrode 70. The dielectric material is deposited conformally so that deposition occurs beneath the semiconductor fin and the pair of cavities may be filled by the dielectric material. Since the dielectric material underneath the semiconductor fin is protected from the reactive ion etch by the semiconductor fin, the dielectric material underneath the semiconductor fin is preserved and forms a pair of dielectric material layers 86 after the reactive ion etch. The pair of dielectric material layers 86 abuts the body 41, the source and drain region 72, and the semiconductor pedestal P.

During the reactive ion etch, the dielectric material is removed at least down to the bottom of the semiconductor fin at the end portions so that the sidewalls of the semiconductor fin are fully exposed. The optional second spacers 88 provide spacing between the gate electrode 70 and the exposed portions of the semiconductor fin so that dopants of the second conductivity type may be introduced into the semiconductor fin without shortening the length of the channel of the finFET. The source and drain regions 72 are fully doped at the end of the doping process.

It is advantageous to have at least a portion of the source and drain regions heavily doped at a high doping level. If the optional second spacers 88 are not formed, the source and drain regions 72 are heavily doped at the processing step corresponding to FIGS. 10A-10D. If the optional second spacers 88 are formed, the source and drain region 72 may be heavily doped at the processing step corresponding to FIGS. 11A-11D.

In case a dielectric material is not deposited in this processing step, i.e., if the processing step of FIGS. 11A-11D is omitted, the pair of cavities are subsequently filled by a middle-of-line (MOL) dielectric so that a pair of dielectric material layers comprising the MOL dielectric is formed underneath the semiconductor fin.

Referring to FIGS. 12A-12D, a metal layer (not shown) is deposited over the first exemplary semiconductor structure and reacted with the underlying semiconductor material to form various metal-semiconductor alloys. Specifically, a gate metal-semiconductor alloy 90 is formed over the gate electrode 70. Source and drain metal-semiconductor alloy 92 is formed over the source and drain regions 72. Optionally, the silicon oxide layer may be lithographically patterned and etched to expose a portion of the first semiconductor layer 30 prior to the deposition of the metal layer so that a body metal-semiconductor alloy (not shown) may be formed. In case the gate electrode 70 and/or the source and drain regions comprise a silicon containing material, the corresponding metal-semiconductor alloy(s) is/are (a) metal silicide(s).

Referring to FIGS. 13A-13D, a middle-of-line (MOL) dielectric layer 100 is deposited over the first exemplary semiconductor structure and planarized. The MOL dielectric layer 100 may comprise, for example, a CVD oxide. The CVD oxide may be an undoped silicate glass (USG), borosilicate glass (BSG), phosphosilicate glass (PSG), fluorosilicate glass (FSG), borophosphosilicate glass (BPSG), or a combination thereof. Various contact via holes are formed in the MOL dielectric layer 100 and filled with metal to from various contact vias. Specifically, source and drain contact vias 99A may be formed directly on the source and drain metal-semiconductor alloy 92. A gate contact via 99B may be formed directly on the gate metal-semiconductor alloy 90. A body contact via 99C may be formed on the first top semiconductor layer 30. If a body metal-silicide alloy (not shown) is formed directly on the first top semiconductor layer 30, the body contact via 99C is formed directly on the body metal-semiconductor alloy.

Figure 14B:
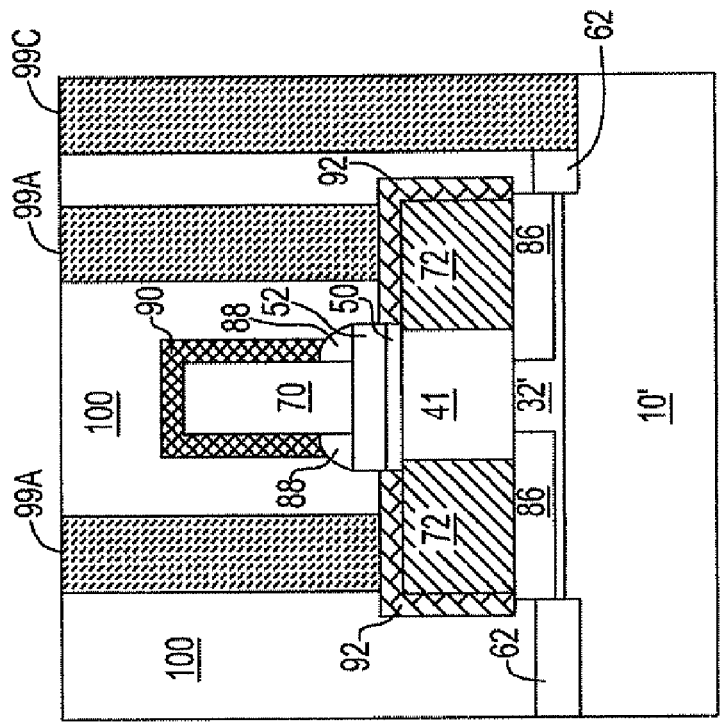
Figure 14A:
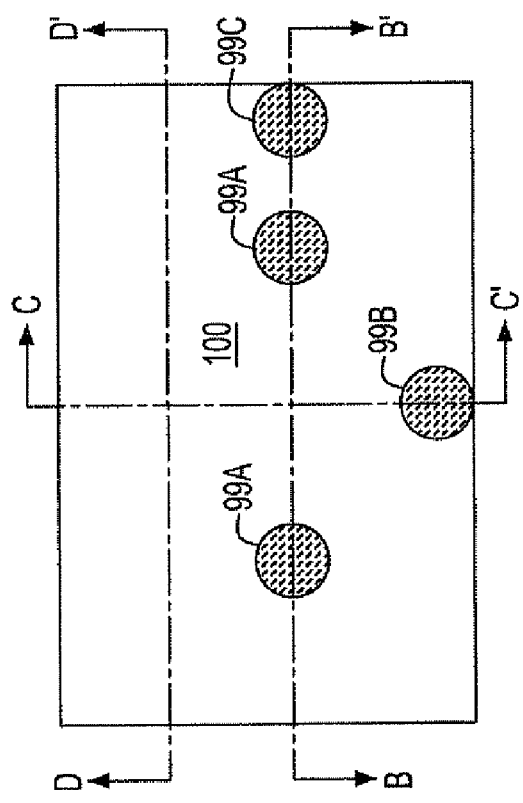
Figure 14D:
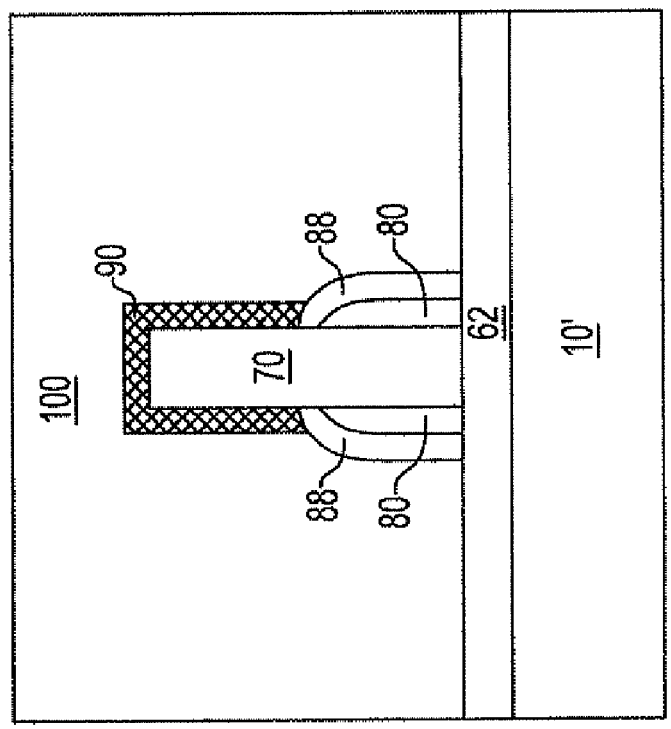
Figure 14C:
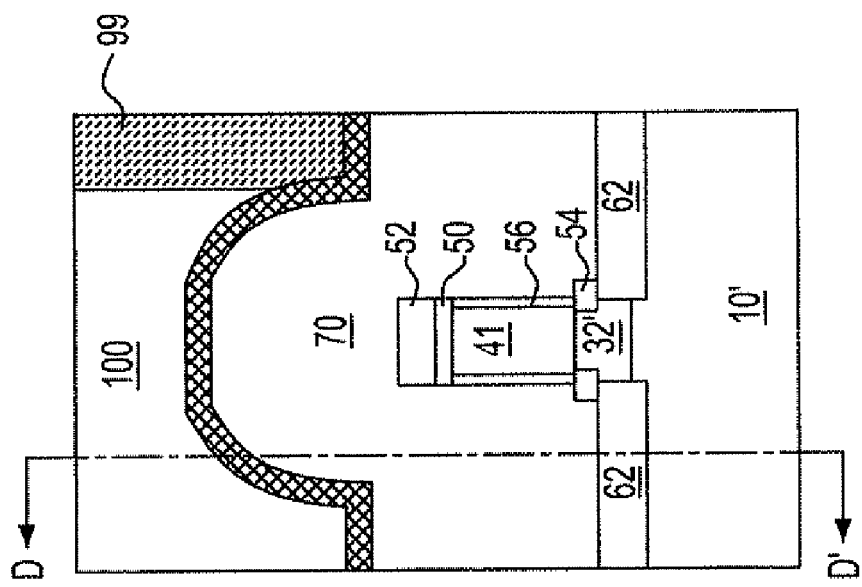

Referring to FIGS. 14A-14C, a variation on the first exemplary semiconductor structure does not have a buried oxide layer 20. Instead, the handle substrate 10 and the first top semiconductor layer 30 are merged into a bulk substrate layer 10', which performs all functions of the handle substrate 10 and the first top semiconductor layer 30. Instead of a silicon-on-insulator substrate or a silicon-germanium-on-insulator substrate, the present invention may be practiced on a bulk substrate as well.

Additional interlevel dielectric layers, metal wiring layers, and interconnect vias may then be formed and patterned by methods well known in semiconductor processing technology.

Embodiment #2

Figure 15A:
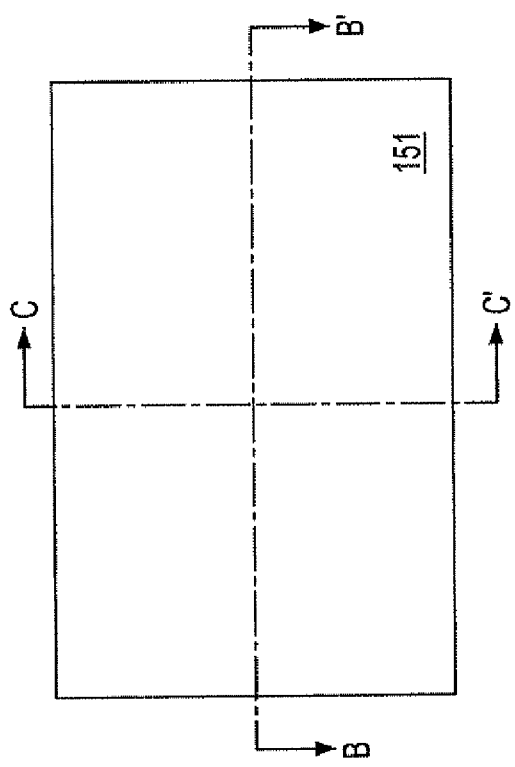
Figure 15B:
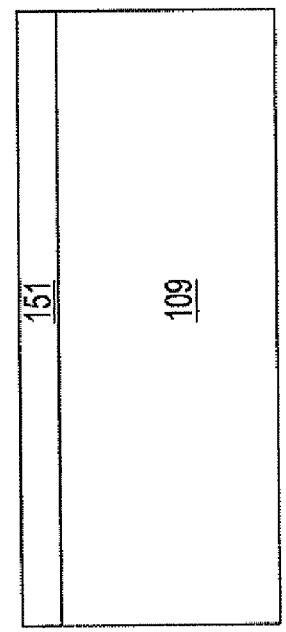
Figure 15C:
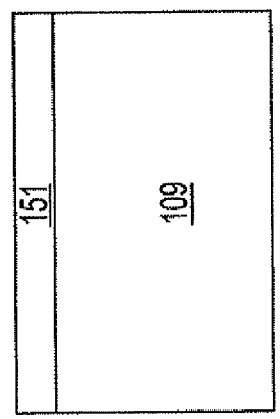
Figure 18C:
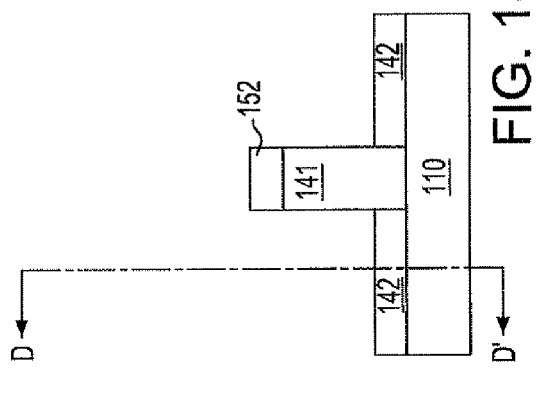
Figure 18D:
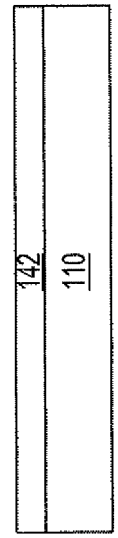
Figure 18A:
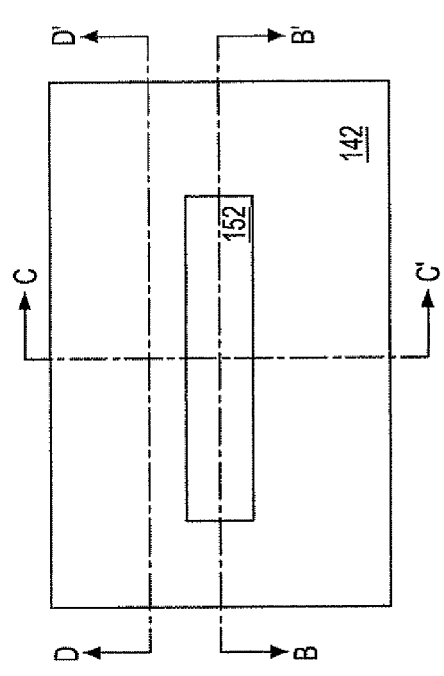
Figure 18B:
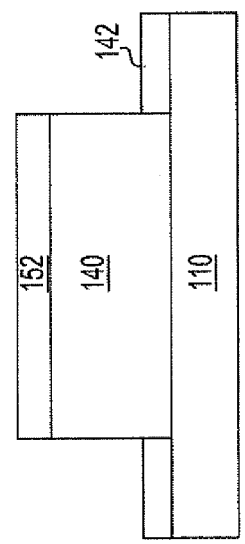
Figure 21A:
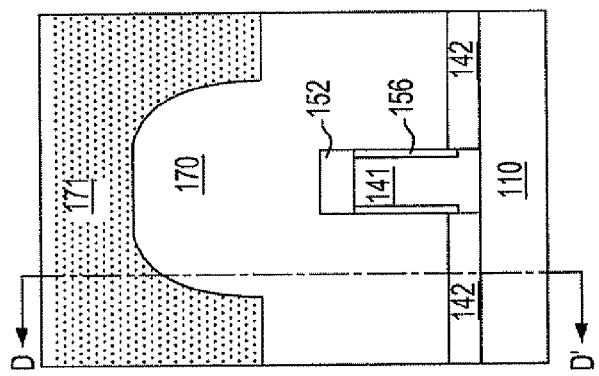
Figure 21B:
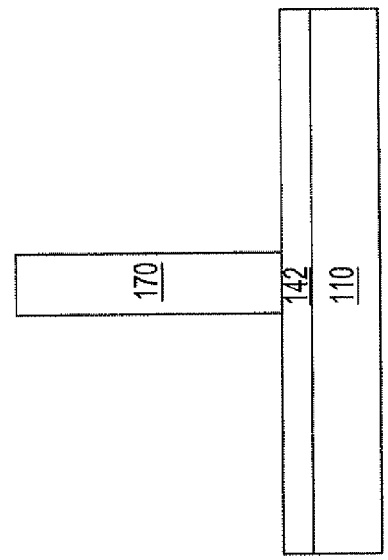
Figure 21C:
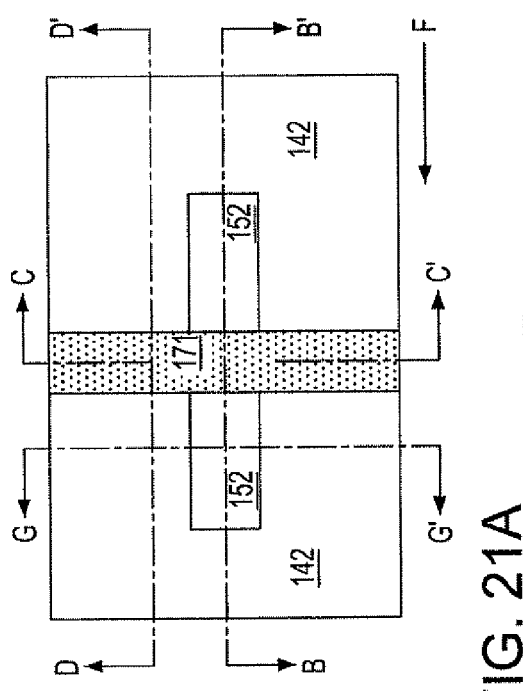
Figure 21D:
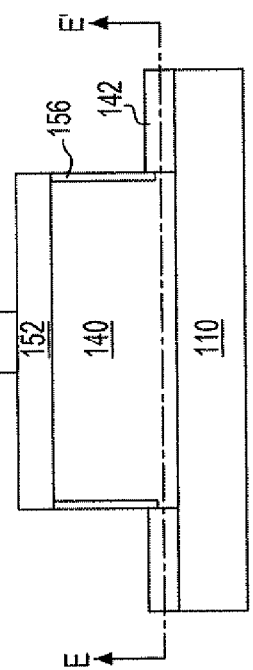
Figure 22C:
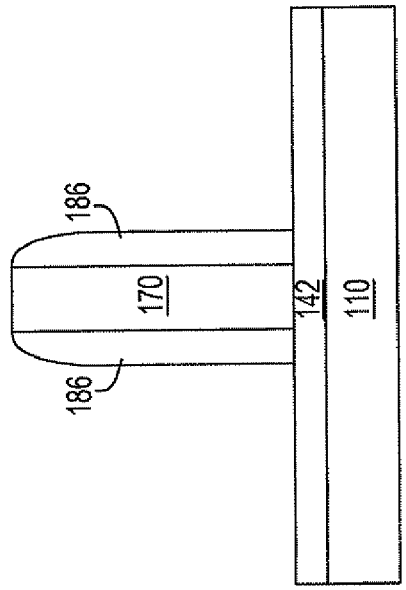
Figure 22D:
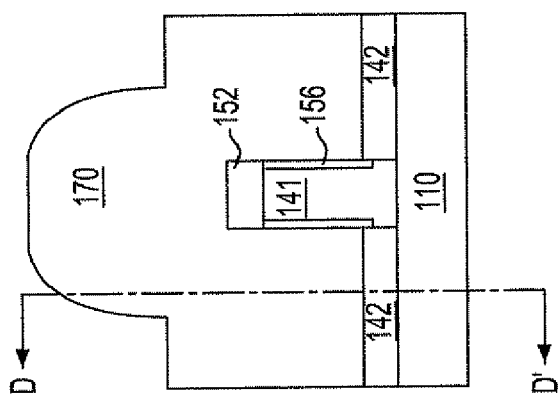
Figure 22A:
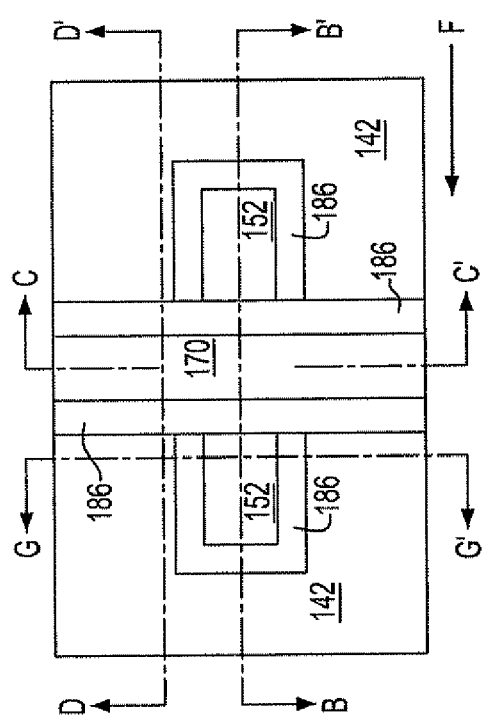
Figure 22B:
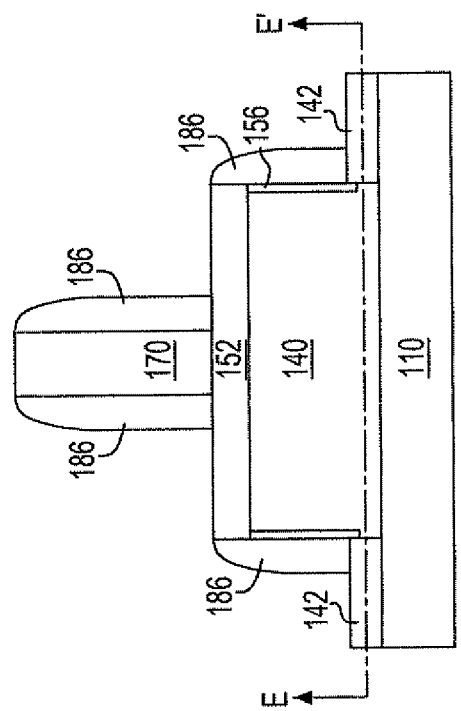
Figure 23C:
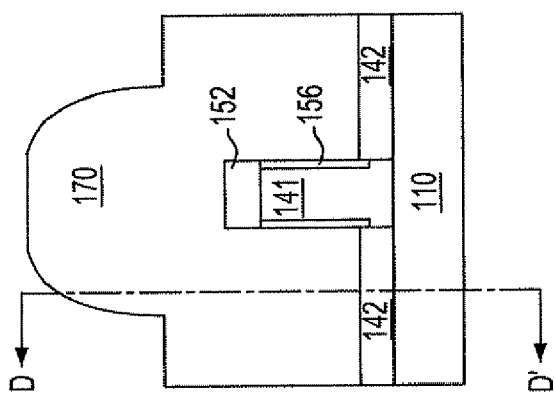
Figure 23D:
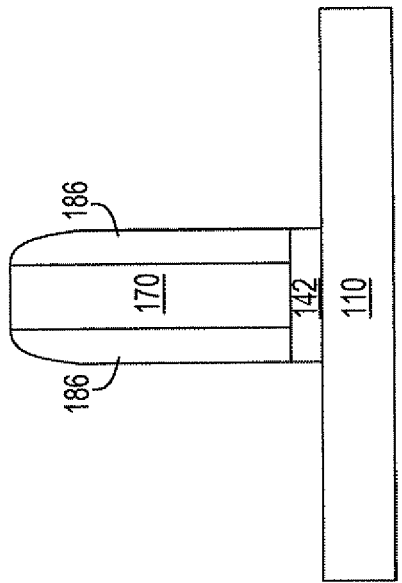
Figure 23A:
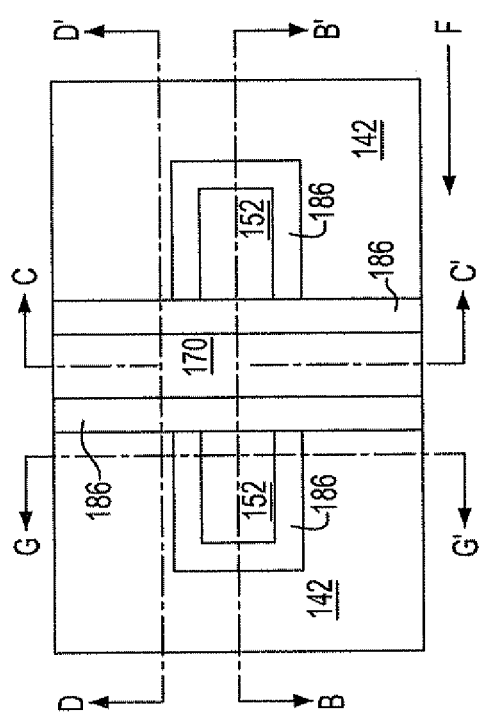
Figure 23B:
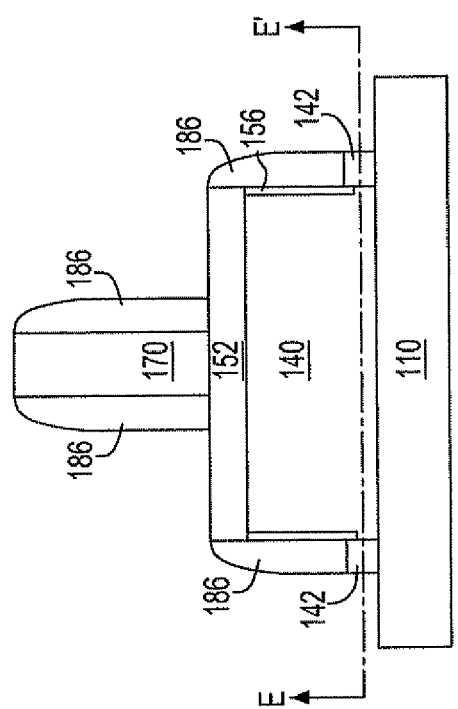
Figure 24A:
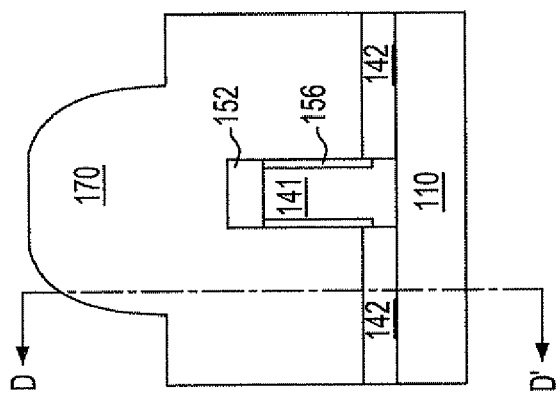
Figure 24C:
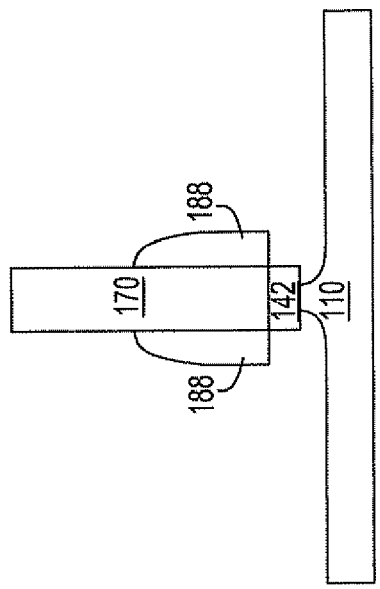
Figure 24B:
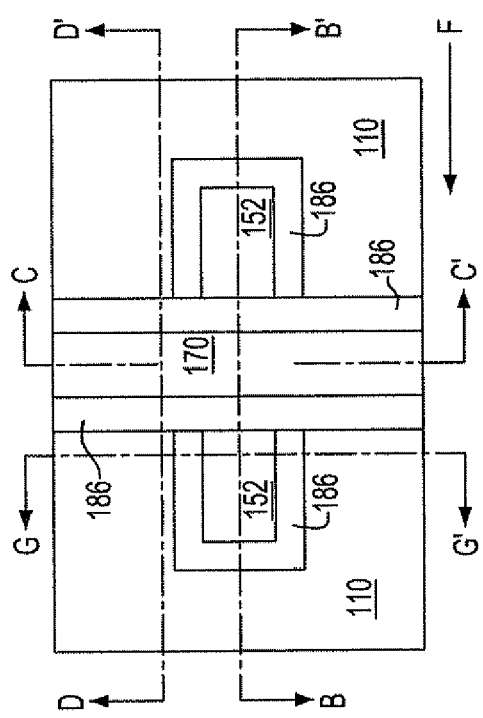
Figure 24D:
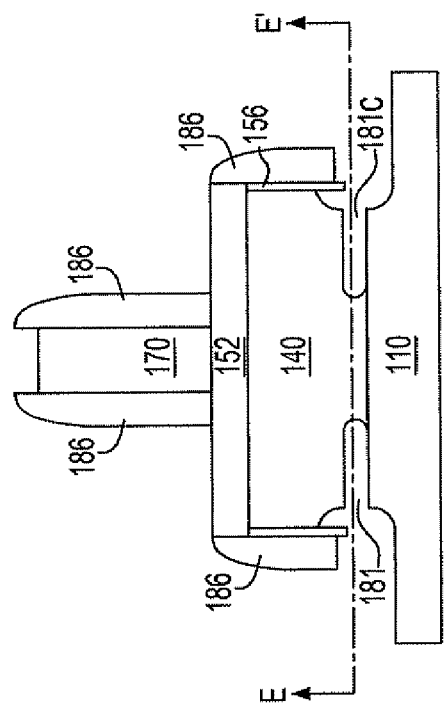
Figure 24G:
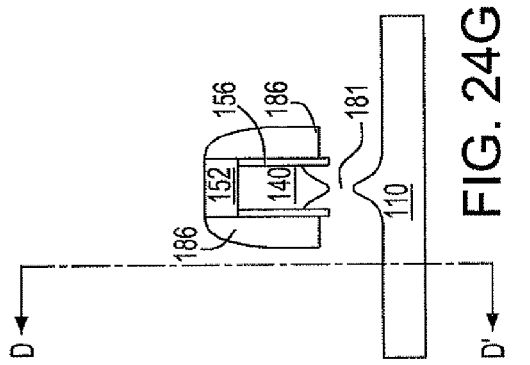
Figure 24E:
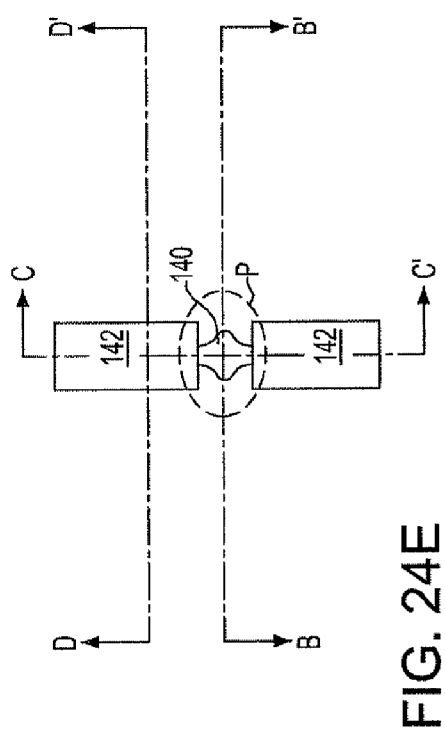
Figure 24F:
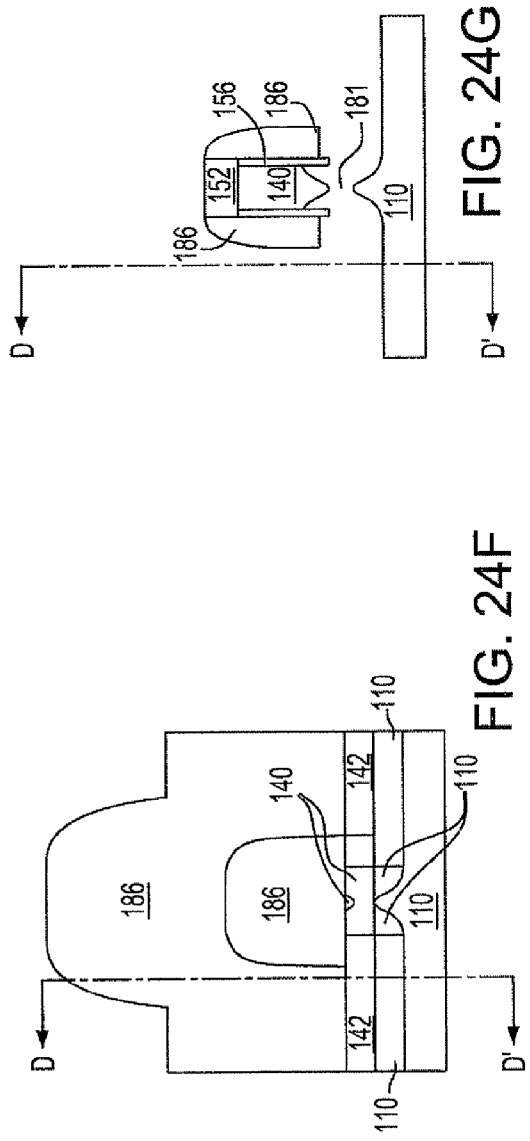
Figure 25C:
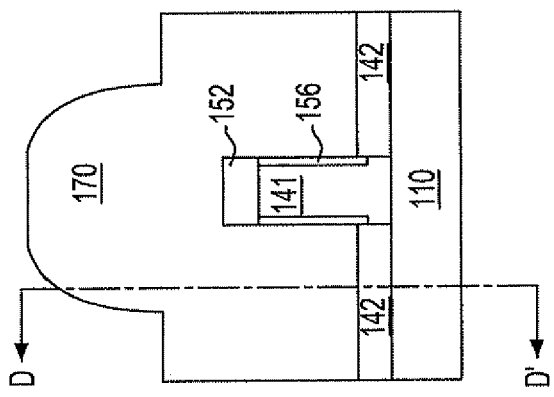
Figure 25D:
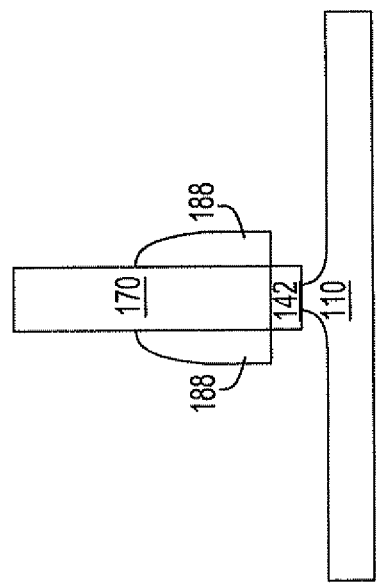
Figure 25A:
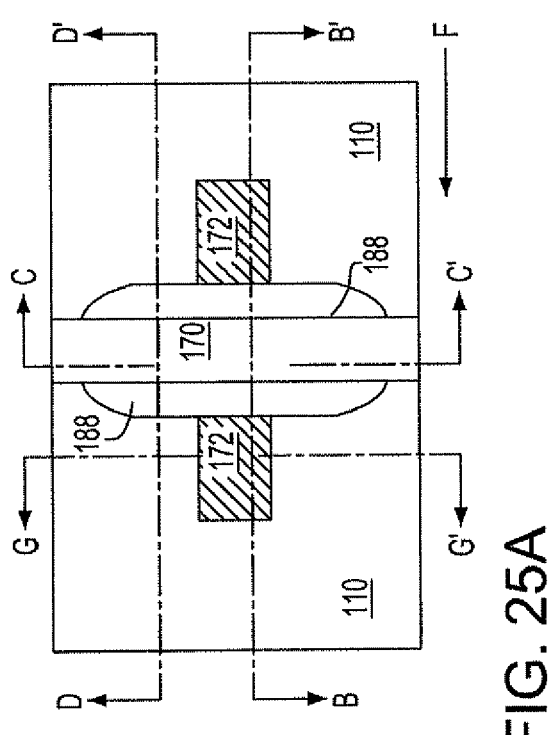
Figure 25B:
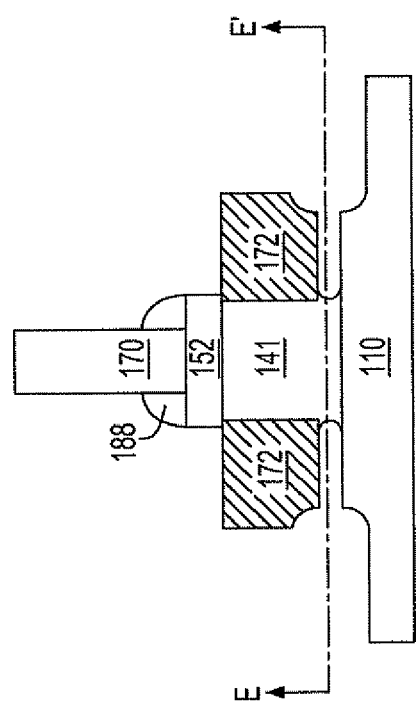
Figure 26C:
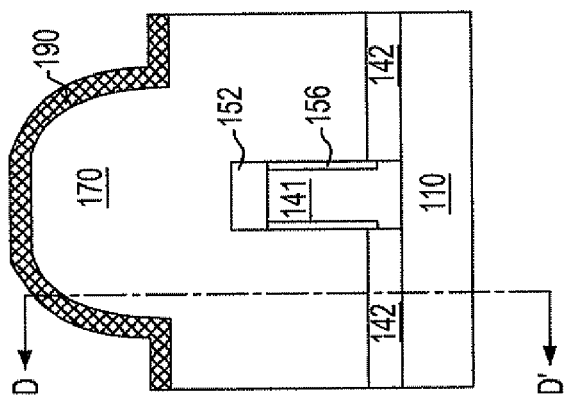
Figure 26D:
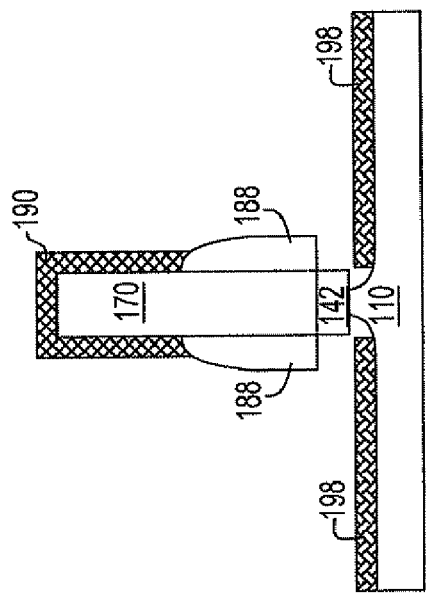
Figure 26A:
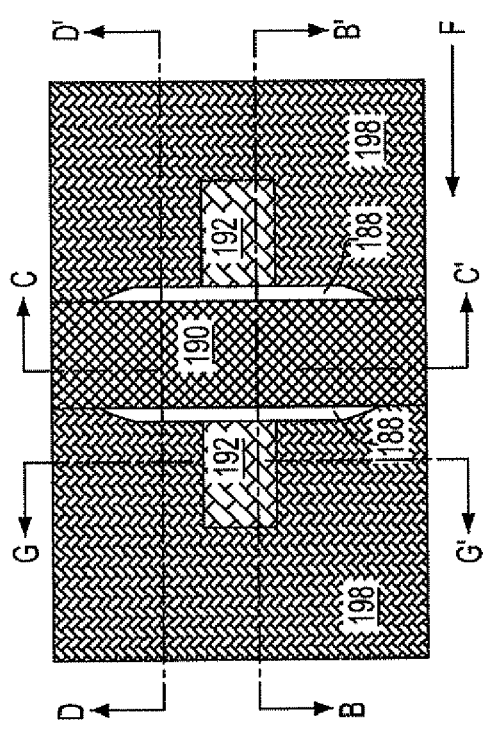
Figure 26B:
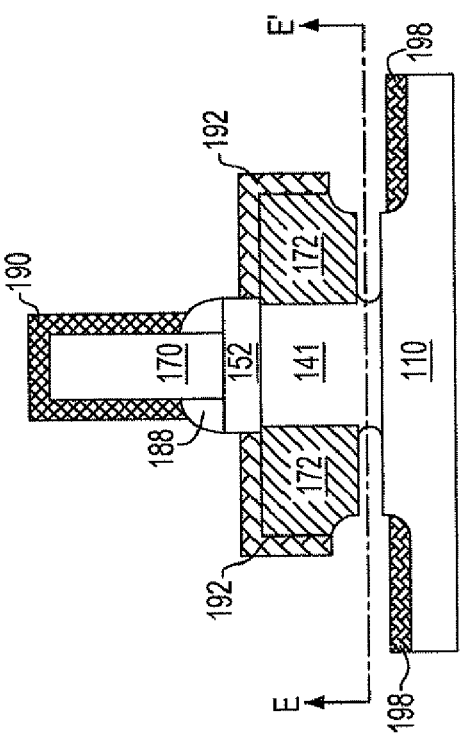
Figure 27B:
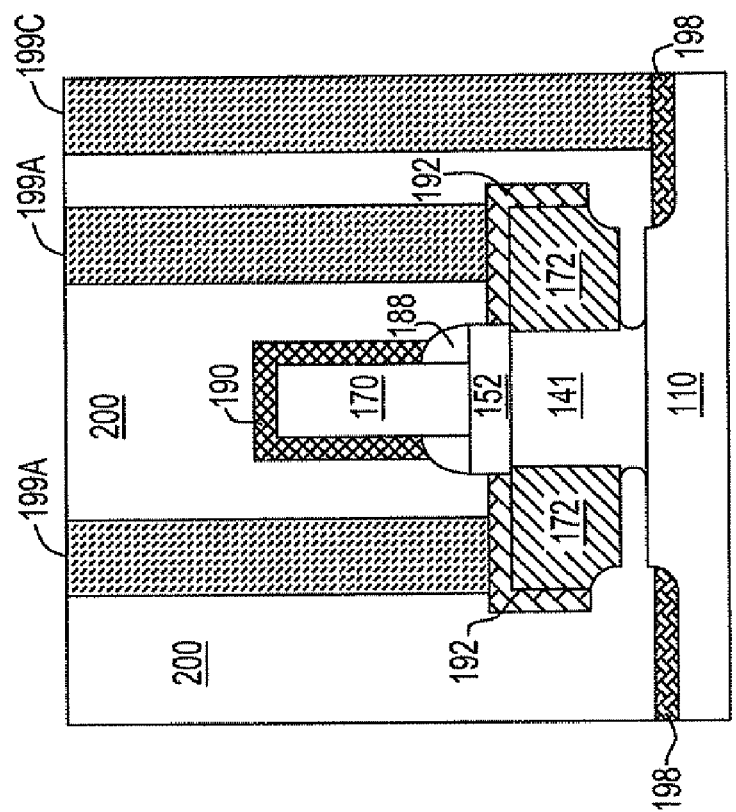
Figure 27A:
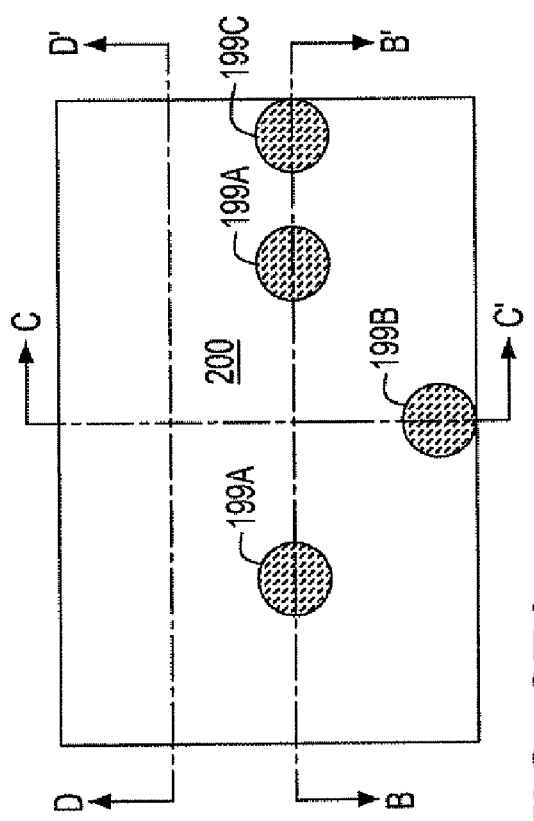
Figure 27D:
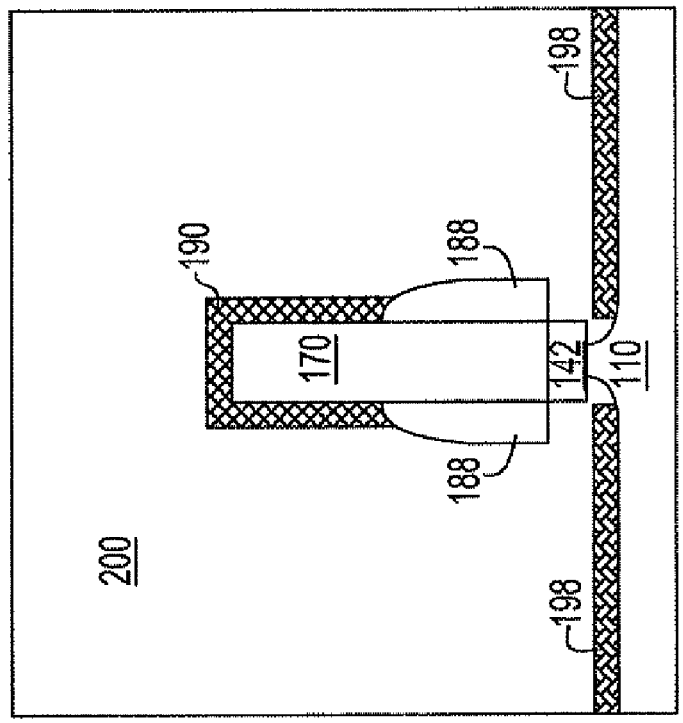
Figure 27C:
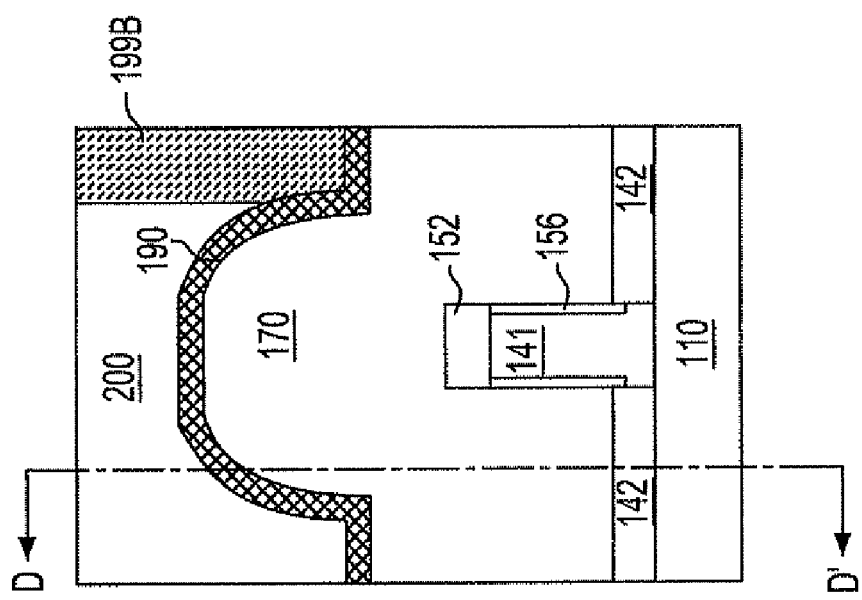

Referring to FIGS. 15A-15C, a second exemplary semiconductor structure according to a second embodiment of the present invention is shown, which comprises a fin cap dielectric layer 151 formed on a top surface of an initial semiconductor substrate 109. The initial semiconductor substrate 109 may comprise any semiconductor material including, but not limited to: Si, SiC, SiGe, SiGeC, Ge alloys, GaAs, InAs, InP, other III-V or II-VI compound semiconductors. It is preferred that the initial semiconductor substrate 109 be composed of a Si-containing semiconductor material, i.e., a semiconductor material that includes silicon. The initial semiconductor substrate 109 may be p-doped or n-doped with a dopant concentration typically from about $5.0\times10^{15}/cm^3$ to about $3.0\times10^{17}/cm^3$. The doping type of the initial semiconductor substrate 109 is herein referred to as a first conductivity type.

The fin cap dielectric layer 151 may comprise a nitride, an oxide, or a stack thereof. The fin cap dielectric layer 152 may be, for example, a silicon nitride layer. The fin cap dielectric may 152 be formed by a blanket chemical vapor deposition (CVD). The thickness of the fin cap dielectric layer may be from about 20 nm to about 120 nm.

Referring to FIGS. 16A-16D, a first photoresist (not shown) is applied to a top surface of the fin cap dielectric layer 151 and lithographically patterned substantially in the shape of a rectangle. The pattern on the first photoresist is transferred into the fin cap dielectric layer 151 by a reactive ion etch to form a fin cap 152 out of the remaining portion of the fin cap dielectric layer 151. The pattern is further transferred into the initial semiconductor substrate 109 to a depth by another reactive ion etch to form a semiconductor fin 140 out of the initial semiconductor substrate 109. The remaining portion of the initial semiconductor substrate 109 that is located beneath the semiconductor fin is herein referred to as a semiconductor substrate 110. The height h of the semiconductor fin 140 is the same as the depth of the recess of the initial semiconductor substrate 109 by the another reactive ion etch. The height h of the semiconductor fin 140 may be from about 50 nm to about 400 nm.

Referring to FIGS. 17A-17D, a planarization oxide 139 is deposited on the second exemplary semiconductor structure and planarized employing the fin cap 152 as a stopping layer. The planarization oxide 139 may comprise, for example, a CVD oxide. The CVD oxide may be an undoped silicate glass (USG), borosilicate glass (BSG), phosphosilicate glass (PSG), fluorosilicate glass (FSG), borophosphosilicate glass (BPSG), or a combination thereof. The planarization oxide 139 may be formed by plasma enhanced chemical vapor deposition (PECVD), low pressure chemical vapor deposition (LPCVD), or high density plasma chemical vapor deposition (HDPCVD).

Referring to FIGS. 18A-18D, the planarization oxide 139 is recessed to form a silicon oxide layer 142 having a cavity, or a hole coinciding with the location of the semiconductor fin 140. Lower portions of the sidewalls of the semiconductor fin 140 are covered with the silicon oxide layer while upper portions of the sidewalls of the semiconductor fin 140 are exposed.

It is noted that the processing steps corresponding to FIGS. 17A-18D may be replaced by processing steps corresponding to FIGS. 3A-4C of the first embodiment of the present invention to form identical structures.

Referring to FIGS. 19A-19C, a gate dielectric 156 is formed on the sidewalls of the semiconductor fin 156. The gate dielectric 156 comprises at least one layer that is resistant to an effective etchant for silicon oxide. For example, thermal oxidation may be performed on exposed surfaces of the semiconductor fin 140 to form a thermal gate oxide, which serves as the gate dielectric 156. Another gate dielectric layer, such as a high-K dielectric material layer may be deposited on the thermal gate oxide to form a composite stack, which may serve as the gate dielectric 156. Alternatively, a chemical vapor deposition gate dielectric, such as a high-K dielectric material layer, may be formed on the sidewalls of the semiconductor fin 140 to serve as the gate dielectric 156.

Referring to FIGS. 20A-20C, a gate conductor layer 169 is formed over the semiconductor fin 140 and the silicon oxide layer 142, for example, by chemical vapor deposition (CVD). The gate conductor layer 169 comprises a conductive material such as doped polysilicon. In case the gate conductor layer 169 comprises doped polysilicon, the gate conductor may be deposited with in-situ doping or may be deposited as intrinsic polysilicon and implanted with dopants subsequently. The thickness of the gate conductor layer 169 may exceed the total height of the semiconductor fin 140 and the fin cap 152. While planarization of the gate conductor layer 169 is not employed in the second exemplary structure, the method of planarizing the gate conductor layer 169 and the resulting structure are explicitly contemplated herein.

Referring to FIGS. 21A-21G, the gate conductor layer 69 is lithographically patterned and etched to form a gate electrode 170. Specifically, a second photoresist 171 is applied over the gate conductor layer 169 and lithographically patterned. The pattern in the second photoresist 171 is then transferred into the gate conductor layer 169 by a reactive ion etch that is selective to the fin cap 152 and the silicon oxide layer 142. The material of the gate conductor layer 169 is removed from the area outside the patterned second photoresist 171. The second photoresist 171 is subsequently removed. A halo implantation may be performed at this point to adjust the threshold voltage of the finFET device to be formed on the semiconductor fin 140.

Referring to FIGS. 22A-22G, first stage dielectric spacers 186 are formed on the sidewalls of the gate electrode 170 and the semiconductor fin 140 by deposition of a dielectric layer and an anisotropic reactive ion etch. During the formation of the first stage dielectric spacers 186, the dielectric layer is minimally etched so the horizontal portions of the dielectric layer are etched while vertical portions of the dielectric layer are preserved. Specifically, the horizontal portions of the dielectric layer is removed from above the silicon oxide layer 142, the top surface of the fin cap 152, and the top surface of the gate electrode 170. The portion of the first stage dielectric spacers 186 around the semiconductor fin 140, which is the remaining vertical portions of the dielectric layer, covers at least the bottom edge of the sidewalls of the fin cap 152. Therefore, the gate dielectric 156 is completely sealed by the combination of the fin cap 152, the first stage dielectric spacer 186, and the silicon oxide layer 142. The sealing of the gate dielectric enables isotropic etching of the silicon oxide layer 142 without damaging the gate dielectric in a subsequent processing step.

The first stage dielectric spacers 186 may comprise a nitride, an oxide, or a combination thereof. The first stage dielectric spacers 186 may be silicon nitride. The thickness of the first stage dielectric spacers 186, as measured laterally from the gate electrode 170 at the base of the optional first stage dielectric spacers 186, may be from about 5 nm to about 60 nm.

Referring to FIGS. 23A-23G, the exposed portions of the silicon oxide layer 142, i.e., the portions of the silicon oxide layer 142 that are not covered by the gate electrode 170 or by the semiconductor fin 140 as seen from above in a top-down view, is etched by an anisotropic reactive ion etch. The anisotropic reactive ion etch is preferably selective to the fin cap 152, the gate electrode 170, and the first stage dielectric spacers 186. At the end of the reactive ion etch, the semiconductor substrate 110 is exposed outside the combined areas of the semiconductor fin 140, the gate electrode 170, and the first stage dielectric spacers 186 as seen from above in a top-down view.

Referring to FIGS. 24A-24G, the silicon oxide layer 142 is undercut from the exposed surfaces by a first isotropic etch while preserving the first stage dielectric spacer 186 and the first stage dielectric spacer 186. The extent of the first isotropic etch and the consequent reduction in the size of the silicon oxide layer 142 are seen, for example, in FIG. 24E. Preferably, the first isotropic etch is also selective to the gate electrode 170. In a preferred version of the second embodiment, the fin cap 152 and the first stage dielectric spacer 186 comprise silicon nitride and the first isotropic etch is a wet etch in hydrofluoric acid (HF), which provides a high selectivity of the etch rate of the silicon oxide to silicon nitride.

Further, exposed semiconductor surfaces after the first isotropic etch are then etched by a second isotropic etch selectively to the fin cap 152 and the first stage dielectric spacers 186. Specifically, the portion of the semiconductor fin 140, from above which the silicon oxide layer 142 is removed by the first isotropic etch, is now isotropically etched. Further, the exposed surfaces of the semiconductor substrate 110 is also isotropically etched by the second isotropic etch. The second isotropic etch may be a wet etch or an isotropic reactive ion etch. Preferably, the semiconductor substrate 110 and the semiconductor fin 140 comprise silicon doped with dopants of the first conductivity type, the fin cap 152 and the first stage dielectric spacer 186, and the second isotropic etch is a silicon etch with a high selectivity to silicon nitride. For example, the second isotropic etch may be an isotropic reactive ion etch employing HCl or $NF_3$. The gate electrode 170 may be partially etched, i.e., recessed from the original surface during the second isotropic etch.

Since the second isotropic etch is isotropic, semiconductor material is etched during the second isotropic etch process such that the remaining semiconductor material maintains a surface contour at the same distance away from the original semiconductor surface at the beginning of the etch. Since the original exposed semiconductor surfaces on the sidewalls of the semiconductor fin 140 are rectangular on each side, two parallel concave grooves are formed along the length of the semiconductor fin 140, i.e., in the direction perpendicular to the direction of the gate electrode 170. The semiconductor fin 140 develops a bottom surface containing two parallel curved grooves with a concave curvature. The second isotropic etch proceeds until the two parallel grooves with a concave curvature are adjoined in the middle forming a ridge between the two grooves. Once the two grooves are joined, the end portions of the semiconductor fin 140 are disconnected from the semiconductor substrate 110. Further, another groove develops from each of the two end walls of the semiconductor fin 140, i.e., the walls that are parallel to the sidewalls of the gate conductor 170.

As the two parallel grooves are formed on each end portion of the semiconductor fin 140, the semiconductor substrate 110 is also etched at the same time. The semiconductor substrate develops two adjoined curved grooves with a concave curvature on a top surface underneath each end portion of the semiconductor fin 140. As the semiconductor fin 140 becomes disjoined from the semiconductor substrate 110 in the end portions of the semiconductor fin 140, the two grooves with a concave curvature in the semiconductor substrate 110 are adjoined to each other.

The duration of the second isotropic etch is controlled so that a portion of the semiconductor fin 140 remains under the gate electrode 170 after the completion of the second isotropic etch. The remaining portion of the semiconductor fin 140 constitutes a semiconductor pedestal P that is the only non-dielectric-material structural connection between the semiconductor fin 140 and the semiconductor substrate 10. Thus, the semiconductor pedestal is the only electrically conductive path between the semiconductor fin 140 and the semiconductor substrate 10. The semiconductor pedestal P may have two parallel straight edges abutting the remaining portions of the silicon oxide layer 142. The semiconductor pedestal P may have four concave surfaces as shown in the horizontal cross-sectional view of the semiconductor pedestal in FIG. 24E. Alternatively, semiconductor pedestal P may have faceted crystallographic surfaces that can be generated in a crystallographic etch process. A pair of cavities 181 is formed underneath the remaining portion of the semiconductor fin 141 above the semiconductor pedestal P.

Referring to FIGS. 25A-25D, first stage dielectric spacers 186 are further etched by an anisotropic reactive ion etch so that the portions of the semiconductor fin 140 more than the thickness of the first stage dielectric spacers 186 away from the gate electrode 170 are free of any remaining dielectric layer. The thickness of the first stage dielectric spacers 186 is measured at the base of the first stage dielectric spacers 186 on the gate electrode 170. Further, the portions of the fin cap 152 that are not masked by the gate electrode 170 or the first stage dielectric spacers 186 are etched by the anisotropic reactive ion etch to expose top surfaces of the semiconductor fin 140. Preferably, the anisotropic reactive ion etch is selective to the semiconductor fin 140. Also, the anisotropic reactive ion etch is also selective to the gate electrode 170. The further etched first stage dielectric spacers constitute second stage dielectric spacers 188. The second stage dielectric spacers 188 has a reduced height relative to the first stage dielectric spacers 186, as is evident when FIG. 25F is compared with FIG. 24F.

Source and drain regions 172 are formed on the exposed portions of the semiconductor fin 140 that are not covered by the gate electrode 170 and/or the second stage dielectric spacers 188 at this processing step. Ion implantation or other doping techniques such as gas phase doping or plasma doping may be employed to introduce dopants of a second conductivity type into the end portions of the semiconductor fin. The second conductivity type is the opposite of the first conductivity type. The dose of dopants introduced into the source and drain regions 172 is preferably at a high doping level suitable for source and drain main regions, e.g., from about $1.0 \times 10^{20}/cm^3$ to about $2.0 \times 10^{21}/cm^3$.

The remaining portion of the semiconductor fin 140 above the semiconductor pedestal P after excluding the source and drain regions 172 constitutes a body 141 of the finFET. The body 141, the semiconductor pedestal P, and portion of the semiconductor substrate 110 directly underneath the semiconductor pedestal are doped with dopants of a first conductivity type.

A dielectric material (not shown) may be optionally deposited and etched by a reactive ion etch to form a pair of dielectric material layers (not shown) in a similar manner as shown in FIGS. 11A-11D of the first embodiment.

Referring to FIGS. 26A-26G, a metal layer (not shown) is deposited over the second exemplary semiconductor structure and reacted with the underlying semiconductor material to form various metal-semiconductor alloys. Specifically, a gate metal-semiconductor alloy 190 is formed over the gate electrode 170. Source and drain metal-semiconductor alloy 192 is formed over the source and drain regions 172. Body metal-semiconductor alloy 198 is formed over portions of the semiconductor substrate 110. Since the metal layer is not perfectly collimated, some metal is deposited on the portion of the semiconductor substrate 110 located directly underneath (but not adjoined to) the semiconductor fin 140, which now comprises the source and drain regions 172 and the body 141. Thus, the area of the body metal-semiconductor alloy overlaps the area of the semiconductor fin 140 as seen from above in a top down view, which is the same as a horizontal cross-sectional area of the semiconductor fin 140 since the semiconductor fin 140 has substantially the same cross-sectional area throughout its height. In case the semiconductor fin 140, the gate electrode 170, and/or the semiconductor substrate 110 comprise silicon, the various metal-semiconductor alloys comprise a metal silicide.

Referring to FIGS. 27A-27D, a middle-of-line (MOL) dielectric layer 200 is deposited over the second exemplary semiconductor structure and planarized. The MOL dielectric layer 200 may comprise, for example, a CVD oxide. The CVD oxide may be an undoped silicate glass (USG), borosilicate glass (BSG), phosphosilicate glass (PSG), fluorosilicate glass (FSG), borophosphosilicate glass (BPSG), or a combination thereof. Various contact via holes are formed in the MOL dielectric layer 200 and filled with metal to from various contact vias. Specifically, source and drain contact vias 199A may be formed directly on the source and drain metal-semiconductor alloy 192. A gate contact via 199B may be formed directly on the gate metal-semiconductor alloy 190. A body contact via 199C may be formed directly on the body metal-semiconductor alloy 198.

Additional interlevel dielectric layers, metal wiring layers, and interconnect vias may then be formed and patterned by methods well known in semiconductor processing technology.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of manufacturing a semiconductor structure, comprising:

forming a semiconductor fin containing a silicon layer and a silicon germanium layer on a semiconductor substrate, wherein said silicon germanium layer is located directly beneath said silicon layer and said silicon germanium layer has an atomic concentration of germanium from about 2 to about 15 percent;

forming a silicon oxide layer directly on said semiconductor substrate and sidewalls of said silicon germanium layer, wherein said silicon oxide layer is disjoined from said silicon layer;

forming a silicon germanium oxide ring on said semiconductor fin out of said silicon germanium layer;

forming a gate dielectric directly on said semiconductor fin;

forming a gate conductor directly on said gate dielectric;

removing portions of said silicon germanium ring from outside an area of said gate conductor to from two disjoined silicon germanium oxide blocks abutting said gate conductor;

removing said silicon germanium alloy layer from end portions of said semiconductor fin by a substantially isotropic etch, wherein a remaining portion of said silicon germanium alloy layer in a center portion of said semiconductor fin constitutes a semiconductor pedestal providing an electrically conductive path between said semiconductor fin and said semiconductor substrate; and forming source and drain regions within said end portions of said semiconductor fin, wherein the remainder of said semiconductor fin not including said source and drain regions constitutes a body, said body and said semiconductor pedestal and said semiconductor substrate are doped with dopants of a first conductivity type, said source and drain regions are doped with dopants of a second conductivity type, and said second conductivity type is the opposite of said first conductivity type.

* * * * *